(12) United States Patent
Kato et al.

(10) Patent No.: US 6,459,534 B1
(45) Date of Patent: Oct. 1, 2002

(54) PROJECTION OPTICAL SYSTEM AND PROJECTION EXPOSURE APPARATUS WITH THE SAME, AND DEVICE MANUFACTURING METHOD

(75) Inventors: Takashi Kato; Chiaki Terasawa; Hiroyuki Ishii, all of Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/591,218

(22) Filed: Jun. 12, 2000

(30) Foreign Application Priority Data

Jun. 14, 1999 (JP) .......................... 11-167423

(51) Int. Cl.$^7$ ............................ G02B 3/00; G02B 13/18
(52) U.S. Cl. ...................................... 359/649; 359/708
(58) Field of Search ........................... 359/649–651, 359/708, 713–716; 355/53

(56) References Cited

U.S. PATENT DOCUMENTS

| | | | |
|---|---|---|---|
| 4,948,238 A | | 8/1990 | Araki .......................... 359/708 |
| 5,345,292 A | | 9/1994 | Shiozawa et al. .............. 355/67 |
| 5,642,209 A | * | 6/1997 | Baker ........................... 359/10 |
| 5,805,344 A | | 9/1998 | Sasaya et al. ................. 359/649 |
| 5,831,770 A | | 11/1998 | Matsuzawa et al. ........ 359/649 |
| 5,956,182 A | | 9/1999 | Takahashi ................... 359/649 |
| 5,990,926 A | | 11/1999 | Mercado ..................... 347/258 |
| 6,008,884 A | | 12/1999 | Yamaguchi et al. .......... 355/54 |
| 6,016,185 A | * | 1/2000 | Cullman et al. .............. 355/52 |
| 6,229,595 B1 | * | 5/2001 | McKinley et al. ............. 355/53 |

FOREIGN PATENT DOCUMENTS

| | | |
|---|---|---|
| EP | 0 828 172 | 3/1998 |
| JP | 5-34593 | 2/1993 |
| JP | 7-48089 | 5/1995 |
| JP | 7-128592 | 5/1995 |
| JP | 8-179204 | 7/1996 |
| JP | 9-105861 | 4/1997 |
| JP | 10-48517 | 2/1998 |
| JP | 10-79345 | 3/1998 |
| JP | 10-154657 | 6/1998 |
| JP | 10-197791 | 7/1998 |
| JP | 10-325922 | 12/1998 |
| JP | 10-330030 | 12/1998 |
| JP | 10-333030 | 12/1998 |
| JP | 11-6957 | 1/1999 |
| JP | 11-97347 | 4/1999 |
| JP | 11-095095 | 4/1999 |
| JP | 11-119091 | 4/1999 |

OTHER PUBLICATIONS

Robert A. Jones, "Computer–controlled polishing of telescope mirror segments", *Optical Engineering*, 22(2), pp. 236–240 (Mar./Apr. 1983).

* cited by examiner

*Primary Examiner*—Jordan M. Schwartz
(74) *Attorney, Agent, or Firm*—Fitzpatrick, Cella, Harper & Scinto

(57) ABSTRACT

A projection optical system for projecting a pattern of a mask onto a wafer, includes at least one aspherical surface lens having an aspherical surface on one side and a flat surface on the other side, the spherical surface satisfying a relation $|\Delta ASPH/L|>1\times10^{-6}$ where $\Delta ASPH$ is the aspherical amount of the aspherical surface and L is an object-to-image distance of the projection optical system.

10 Claims, 18 Drawing Sheets

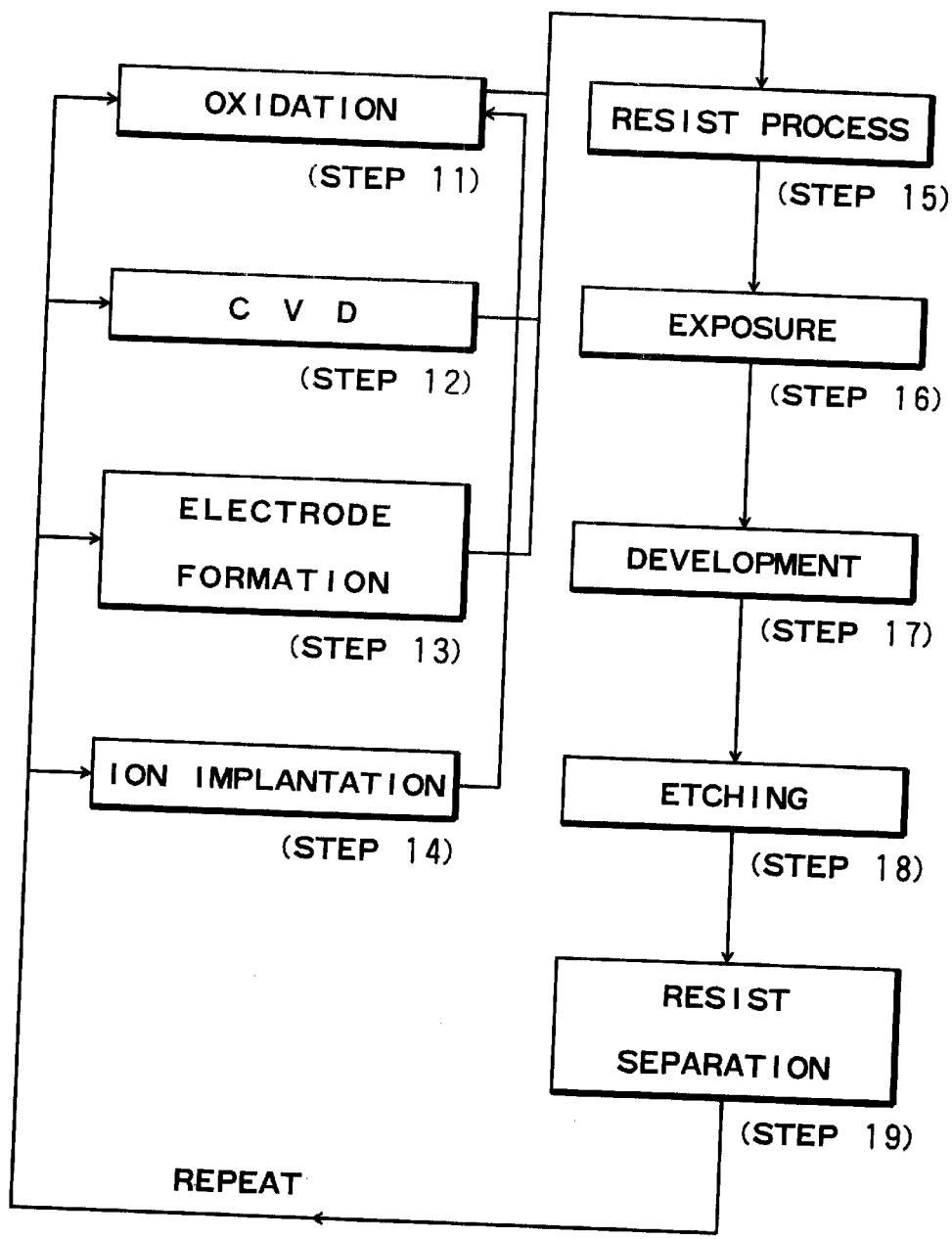
F I G. 18

PROJECTION OPTICAL SYSTEM AND PROJECTION EXPOSURE APPARATUS WITH THE SAME, AND DEVICE MANUFACTURING METHOD

FIELD OF THE INVENTION AND RELATED ART

This invention relates to a projection optical system and a projection exposure apparatus using the same, particularly suitable for manufacture of devices such as ICs, LSIs, magnetic heads, liquid crystal panels, or CCDs, for example, having a very fine structure. More specifically, the invention is suitably usable in a microdevice manufacturing apparatus of step-and-repeat type or step-and-scan type, called a stepper, for projecting and printing a pattern of a reticle on a photosensitive substrate with a high resolution.

Semiconductor manufacturing technologies for production of semiconductor devices, for example, have recently been advanced notably, and microprocessing technologies have also been improved significantly.

Particularly, in optical processing technologies, a reduction projection exposure apparatus, called a stepper, having a resolution of submicron order is used widely. For further improvements in resolution, enlargement of the numerical aperture (NA) of a projection optical system or narrowing the wavelength of exposure light has been attempted.

A projection optical system in a projection exposure apparatus for printing a pattern of a semiconductor device such as IC or LSI, for example, on a wafer of silicon, for example, should have a very high resolution.

Generally, the resolution of a projected image becomes higher with use of a shorter wavelength. Thus, it is desired to use a light source of shorter wavelength.

An example of such a short wavelength light source is an excimer laser. Excimer lasers use a laser medium of ArF or KrF, for example.

With regard to the wavelength region of such a short wavelength light source, only silica (quartz) and fluorite are usable as a glass material for lenses. This is mainly because of smallness of the transmission factor. Even when silica or fluorite is used, if an optical system has many lenses and a large total glass material thickness, there will occur inconveniences such as a shift of the focal point position due to heat absorption by the lens, for example.

Proposals for a reduction type projection optical system, reducing the number of constituent lenses of an optical system and the total lens glass material thickness, have been made (Japanese Published Patent Application, Publication No. 48089/1995, and Japanese Laid-Open Patent Application, Laid-Open No. 128592/1995). Further, a projection optical system being structured telecentric on both of the object side and the image side, has been proposed (Japanese Laid-Open Patent Applications, Laid-Open No. 34593/1993 and No. 197791/1998).

The projection optical systems as proposed in these documents use an aspherical surface lens having an aspherical surface formed on one lens face thereof, and the face (back side face) on the opposite side is formed by a spherical surface.

Generally, if the bottom or opposite face of an aspherical lens is to be formed into a spherical surface, making an aspherical surface itself requires very complicated works. Thus, it takes much time to make the lens. Further, there is a difficulty in optical axis registration between the aspherical surface and the spherical surface. As a result of it, the imaging performance of an assembled projection optical system may be degraded.

SUMMARY OF THE INVENTION

It is an object of the present invention to provide a projection optical system and/or a projection exposure apparatus having the same, in which the number of constituent lenses is reduced but a high resolving power and a wide exposure region are assured.

It is another object of the present invention to provide a projection optical system for use in a projection exposure apparatus, having an aspherical surface lens which can be produced with a relatively simple work and adjustment.

In accordance with an aspect of the present invention, there is provided a projection optical system for projecting a pattern of a mask onto a wafer, wherein said projection optical system includes at least one aspherical surface lens having an aspherical surface on one side and a flat surface on the other side.

In one preferred form of this aspect of the present invention, all aspherical surfaces of said projection optical system may satisfy a relation $|\Delta ASPH/L|>1\times 10^{-6}$ where $\Delta ASPH$ is the aspherical amount of the aspherical surface and L is an object-to-image distance of said projection optical system.

Here, the aspherical amount refers to a deviation between a spherical surface, following a design curvature radius, and an aspherical surface with respect to an optical axis direction.

Said projection optical system may include a plurality of lens groups including a positive refractive power lens group and a negative refractive power lens group, and a relation $|L\times\phi_0|>17$ may be satisfied where L is an object-to-image distance and $\phi_0$ is the sum of powers of the negative lens group or groups.

The aspherical surface may be formed on a surface being in a range satisfying a relation, from the object side, $|h_b/h|>0.35$ where h is a height of an axial marginal light ray, and $h_b$ is a height of a most abaxial chief ray.

The aspherical surface may be formed on a surface satisfying a relation $h_{ea}/h_{max}>0.70$ where $h_{ea}$ is an effective diameter of the surface, and $h_{max}$ is a largest effective diameter of said projection optical system.

The aspherical surface may be formed on a surface being in a range satisfying a relation, from the object side, $|h_b h|>0.35$ where h is a height of an axial marginal light ray, and $h_b$ is a height of a most abaxial chief ray.

The aspherical surface may be formed on a surface satisfying a relation $h_{ea}/h_{max}>0.70$ where $h_{ea}$ is an effective diameter of the surface, and $h_{max}$ is a largest effective diameter of said projection optical system.

The projection optical system may satisfy a relation $|\Delta ASPH/L|<0.02$ where $\Delta ASPH$ is the aspherical amount of the aspherical surface and L is an object-to-image distance of said projection optical system.

The projection optical system may satisfy a relation $|L\times\phi_0|<70$ where L is an object-to-image distance and $\phi_0$ is the sum of powers of a negative lens group.

The projection optical system may satisfy a relation $|h_b/h|<15$ where h is a height of an axial marginal light ray, and $h_b$ is a height of a most abaxial chief ray.

In another preferred form of this aspect of the present invention, said projection optical system may have at least one aspherical surface, and wherein all lenses provided with an aspherical surface are so structured that an aspherical surface is formed on one side and a flat surface is formed on the other side.

In one preferred form of this aspect of the present invention, all aspherical surfaces of said projection optical system may satisfy a relation $|\Delta ASPH/L|>1\times10^{-6}$ where $\Delta ASPH$ is the aspherical amount of the aspherical surface and L is an object-to-image distance of said projection optical system.

Said projection optical system may include a plurality of lens groups including a positive refractive power lens group and a negative refractive power lens group, and a relation $|L\times\phi_0|>17$ may be satisfied where L is an object-to-image distance and $\phi_0$ is the sum of powers of the negative lens group or groups.

The aspherical surface may be formed on a surface being in a range satisfying a relation, from the object side, $|h_b/h|>0.35$ where h is a height of an axial marginal light ray, and $h_b$ is a height of a most abaxial chief ray.

The aspherical surface may be formed on a surface satisfying a relation $h_{ea}/h_{max}>0.70$ where $h_{ea}$ is an effective diameter of the surface, and $h_{max}$ is a largest effective diameter of said projection optical system.

The aspherical surface may be formed on a surface being in a range satisfying a relation, from the object side, $|h_b/h|>0.35$ where H is a height of an axial marginal light ray, and $h_b$ is a height of a most abaxial chief ray.

The aspherical surface may be formed on a surface satisfying a relation $h_{ea}/h_{max}>0.70$ where $h_{ea}$ is an effective diameter of the surface, and $h_{max}$ is a largest effective diameter of said projection optical system.

The projection optical system may satisfy a relation $|\Delta ASPH/L|<0.02$ where $\Delta ASPH$ is the aspherical amount of the aspherical surface and L is an object-to-image distance of said projection optical system.

The projection optical system may satisfy a relation $|L\times\phi_0|<70$ where L is an object-to-image distance and $\phi_0$ is the sum of powers of a negative lens group.

The projection optical system may satisfy a relation $|h_b/h|<15$ where h is a height of an axial marginal light ray, and $h_b$ is a height of a most abaxial chief ray.

In accordance with another aspect of the present invention, there is provided a projection exposure apparatus including a projection optical system as recited above, for projecting a pattern of a reticle onto a photosensitive substrate in accordance with one of a step-and-repeat process and a step-and-scan process.

In accordance with a further aspect of the present invention, there is provided a device manufacturing method for projecting a pattern of a reticle onto a wafer by use of a projection optical system as recited above, and for producing a device through a development process to the wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 18 is a flow chart for explaining details of a wafer process, in the procedure of the flow chart of FIG. 17.

DESCRIPTION OF THE PREFERRED EMBODIMENTS

Preferred embodiments of the present invention will now be described with reference to the accompanying drawings.

Figure 1:
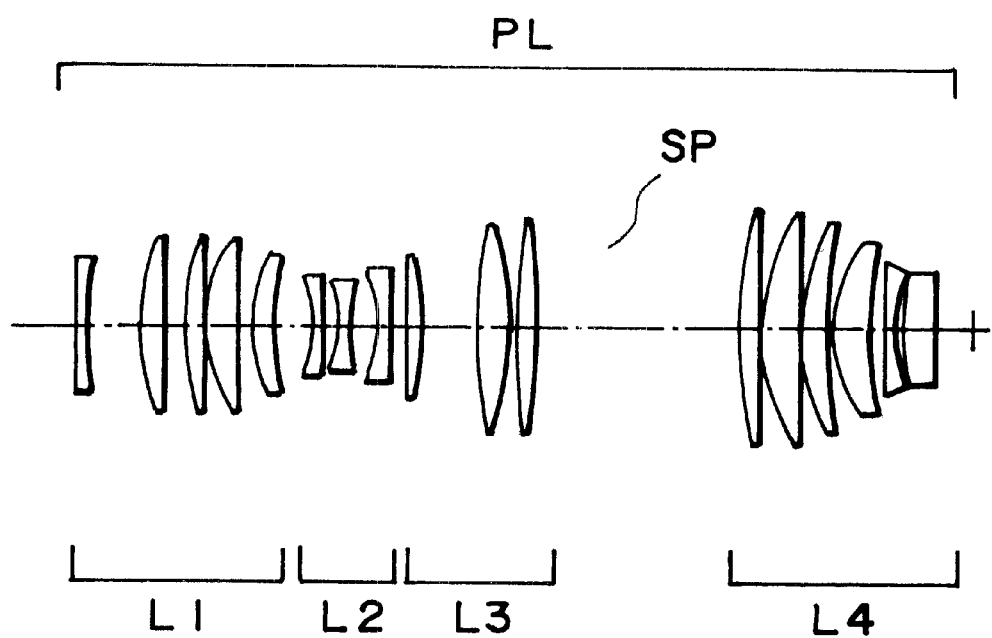
FIG. 1 is a sectional view of a lens system of a projection optical system, according to Numerical Example 1 of the present invention.
Figure 2:
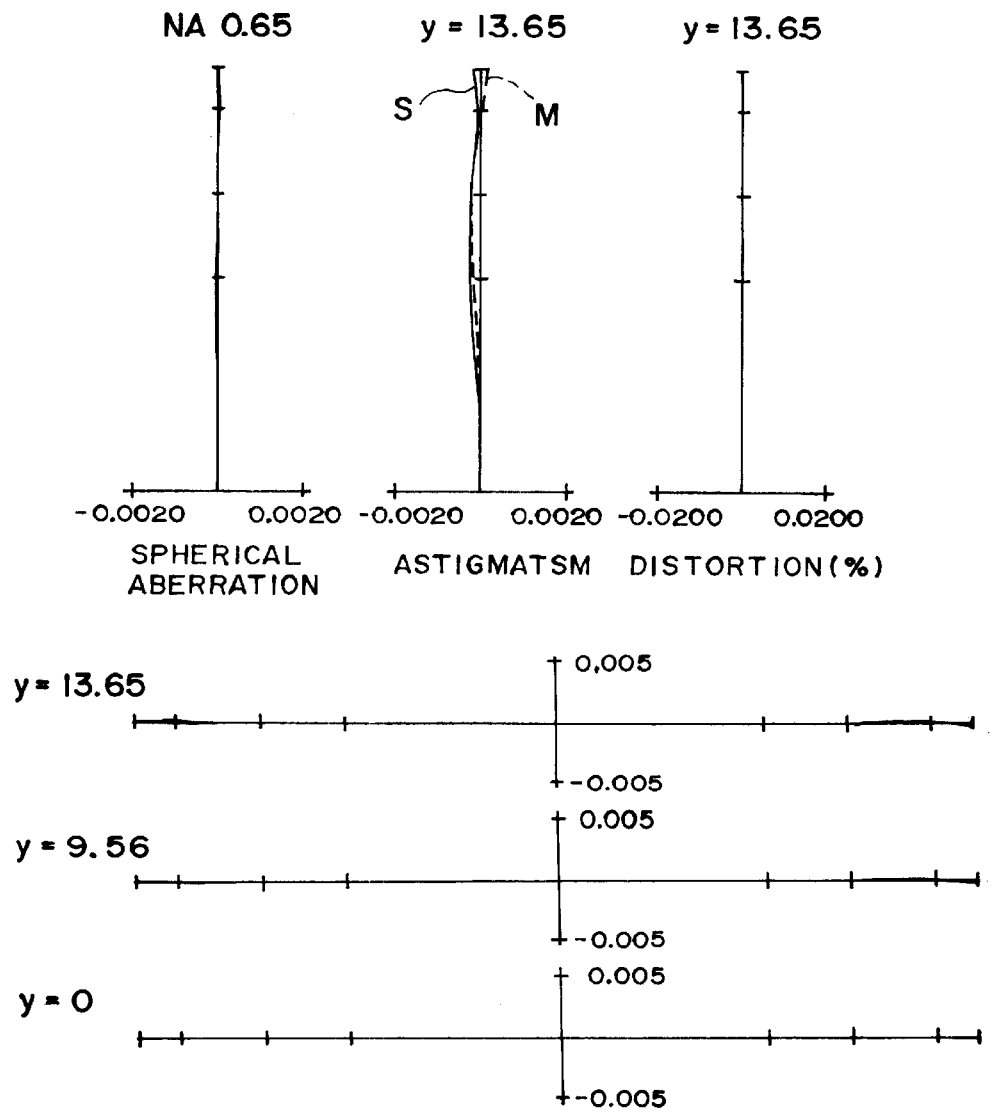
FIG. 2 illustrates aberrations of the projection optical system, in Numerical Example 1 of the present invention.

Of these drawings, FIG. 1 is a sectional view of a lens system of a projection optical system, according to Numerical Example 1 of the present invention. FIG. 2 illustrates aberrations of the projection optical system, in Numerical Example 1 of the present invention.

Figure 3:
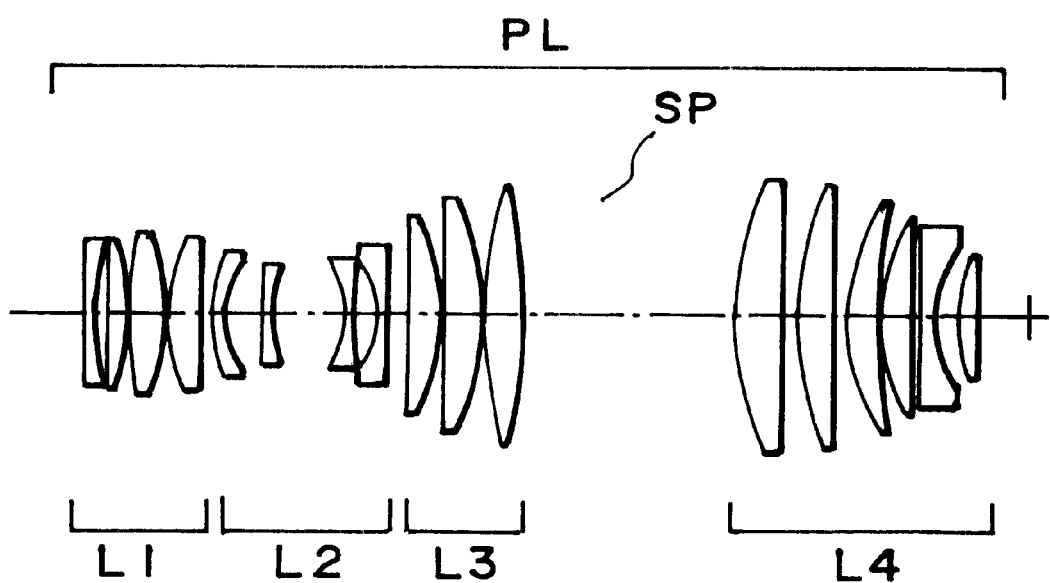
FIG. 3 is a sectional view of a lens system of a projection optical system, according to Numerical Example 2 of the present invention.
Figure 4:
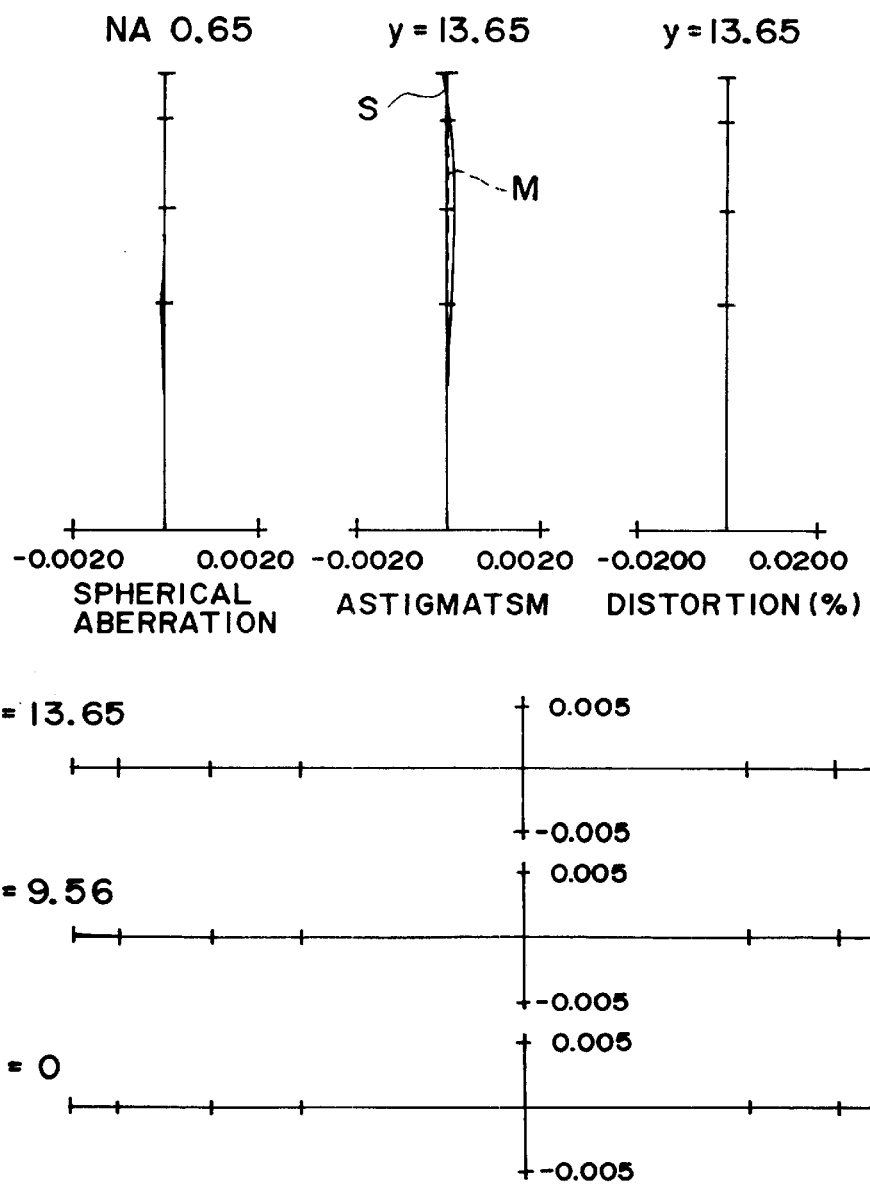
FIG. 4 illustrates aberrations of the projection optical system, in Numerical Example 2 of the present invention.

FIG. 3 is a sectional view of a lens system of a projection optical system, according to Numerical Example 2 of the present invention. FIG. 4 illustrates aberrations of the projection optical system, in Numerical Example 2 of the present invention.

Figure 5:
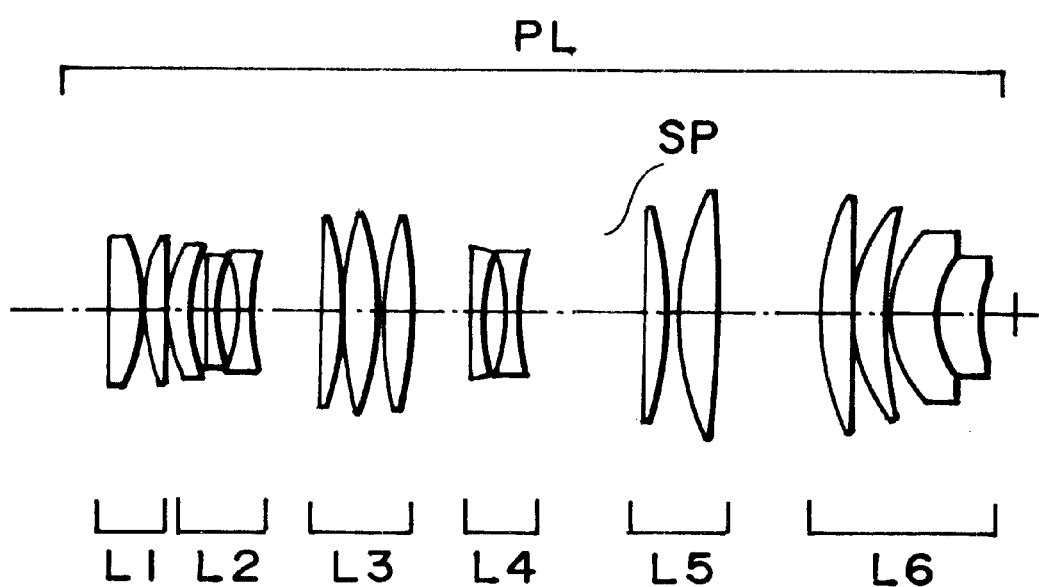
FIG. 5 is a sectional view of a lens system of a projection optical system, according to Numerical Example 3 of the present invention.
Figure 6:
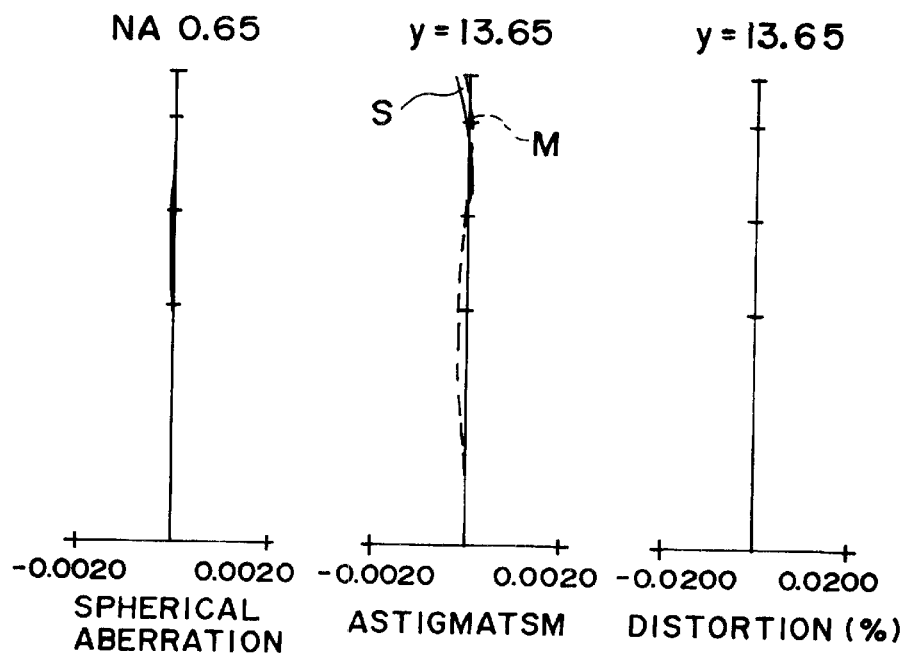
FIG. 6 illustrates aberrations of the projection optical system, in Numerical Example 3 of the present invention.
Figure 6:
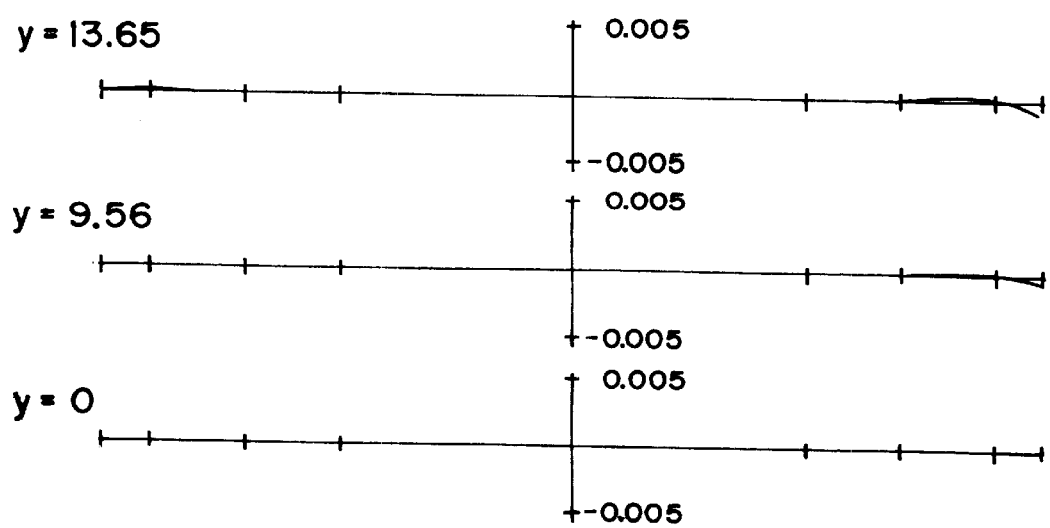

FIG. 5 is a sectional view of a lens system of a projection optical system, according to Numerical Example 3 of the present invention. FIG. 6 illustrates aberrations of the projection optical system, in Numerical Example 3 of the present invention.

Figure 7:
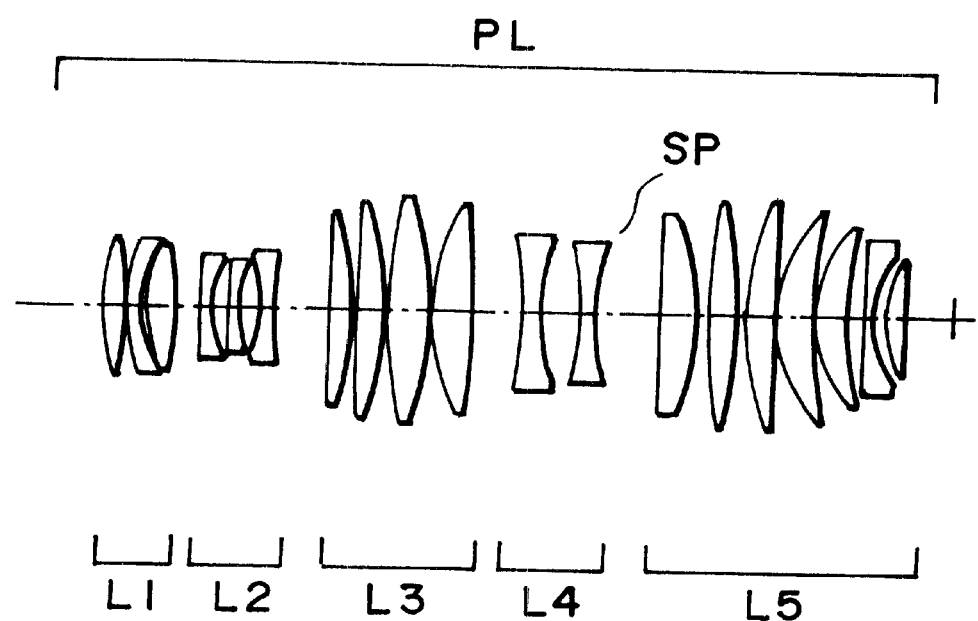
FIG. 7 is a sectional view of a lens system of a projection optical system, according to Numerical Example 4 of the present invention.
Figure 8:
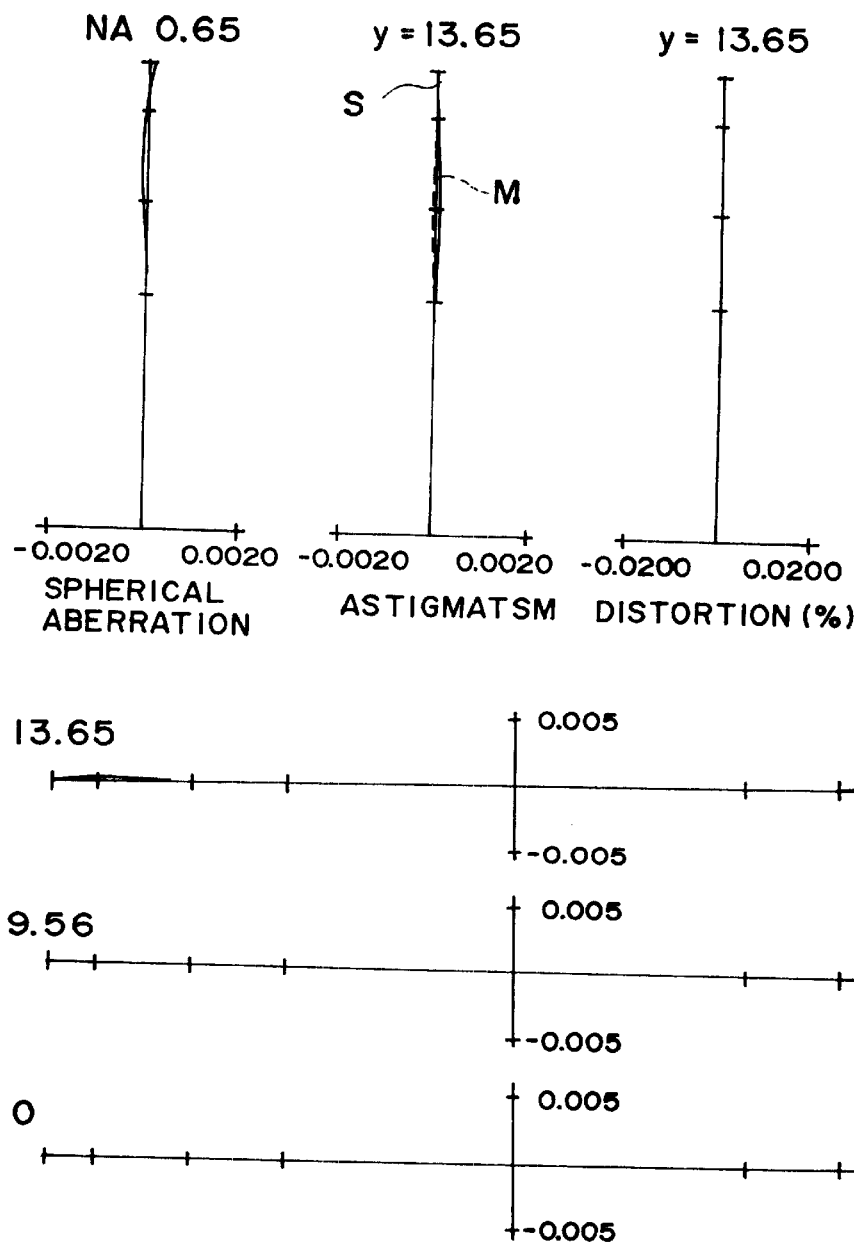
FIG. 8 illustrates aberrations of the projection optical system, in Numerical Example 4 of the present invention.

FIG. 7 is a sectional view of a lens system of a projection optical system, according to Numerical Example 4 of the present invention. FIG. 8 illustrates aberrations of the projection optical system, in Numerical Example 4 of the present invention.

Figure 9:
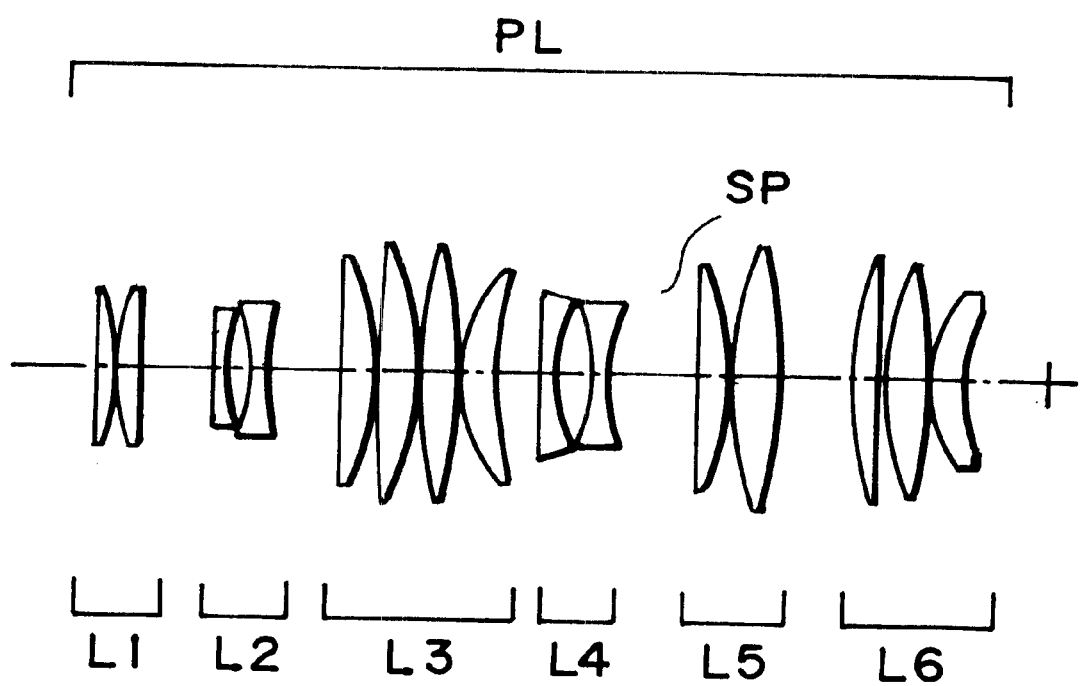
FIG. 9 is a sectional view of a lens system of a projection optical system, according to Numerical Example 5 of the present invention.
Figure 10:
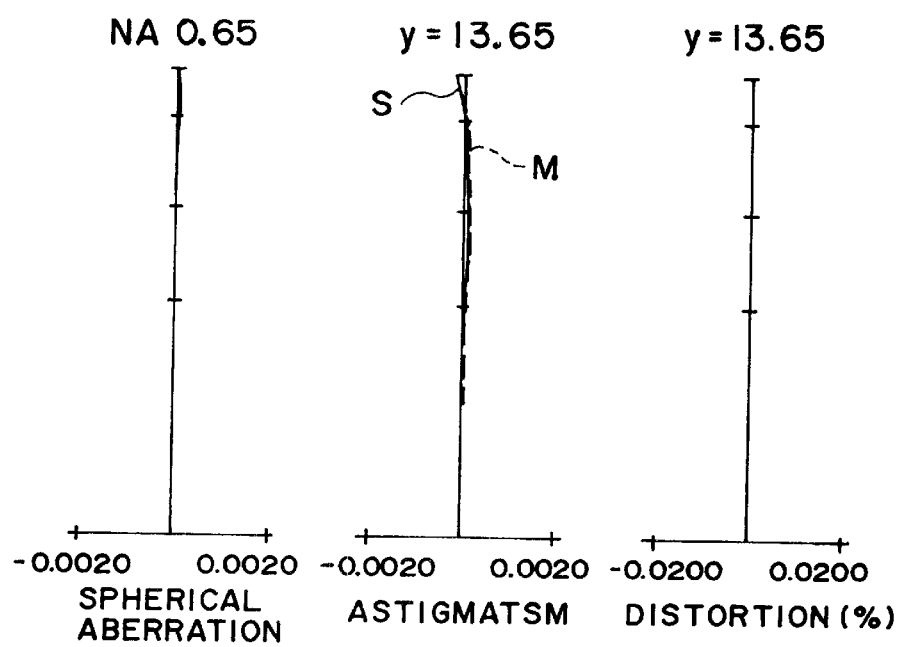
FIG. 10 illustrates aberrations of the projection optical system, in Numerical Example 5 of the present invention.
Figure 10:
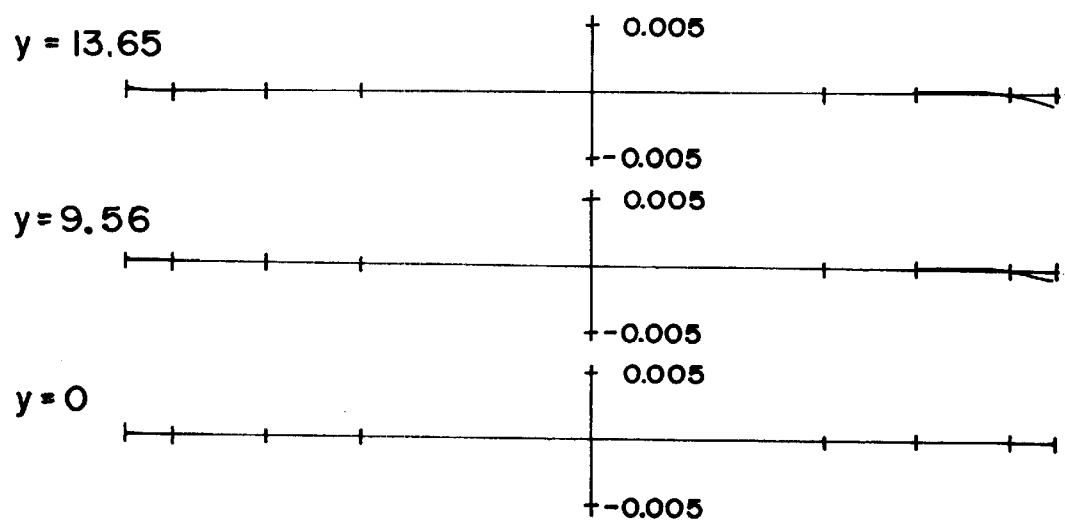

FIG. 9 is a sectional view of a lens system of a projection optical system, according to Numerical Example 5 of the present invention. FIG. 10 illustrates aberrations of the projection optical system, in Numerical Example 5 of the present invention.

Figure 11:
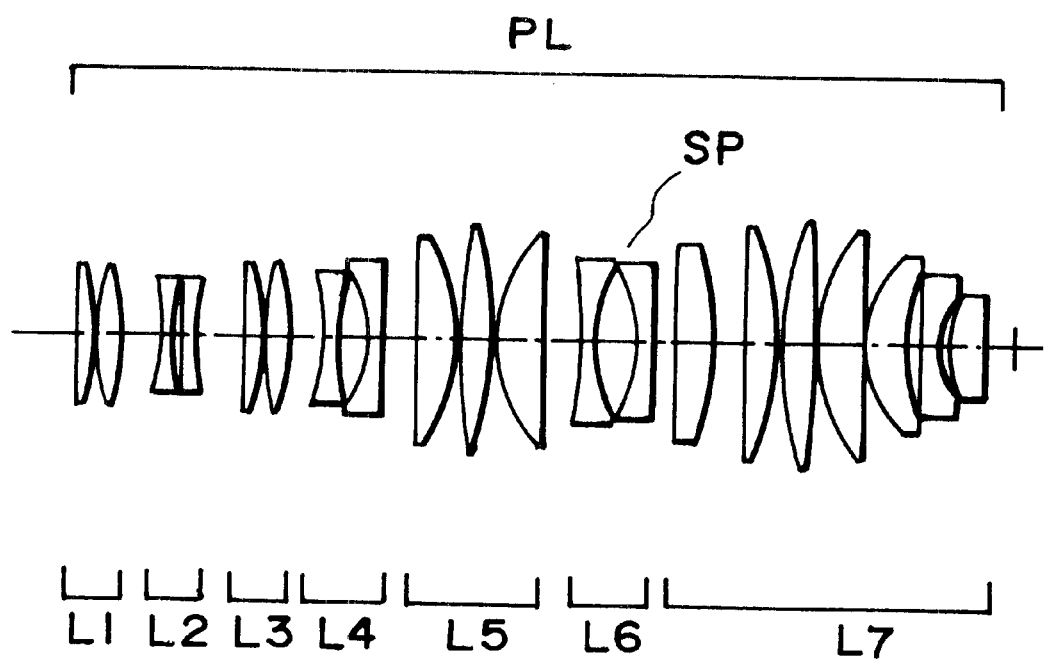
FIG. 11 is a sectional view of a lens system of a projection optical system, according to Numerical Example 6 of the present invention.
Figure 12:
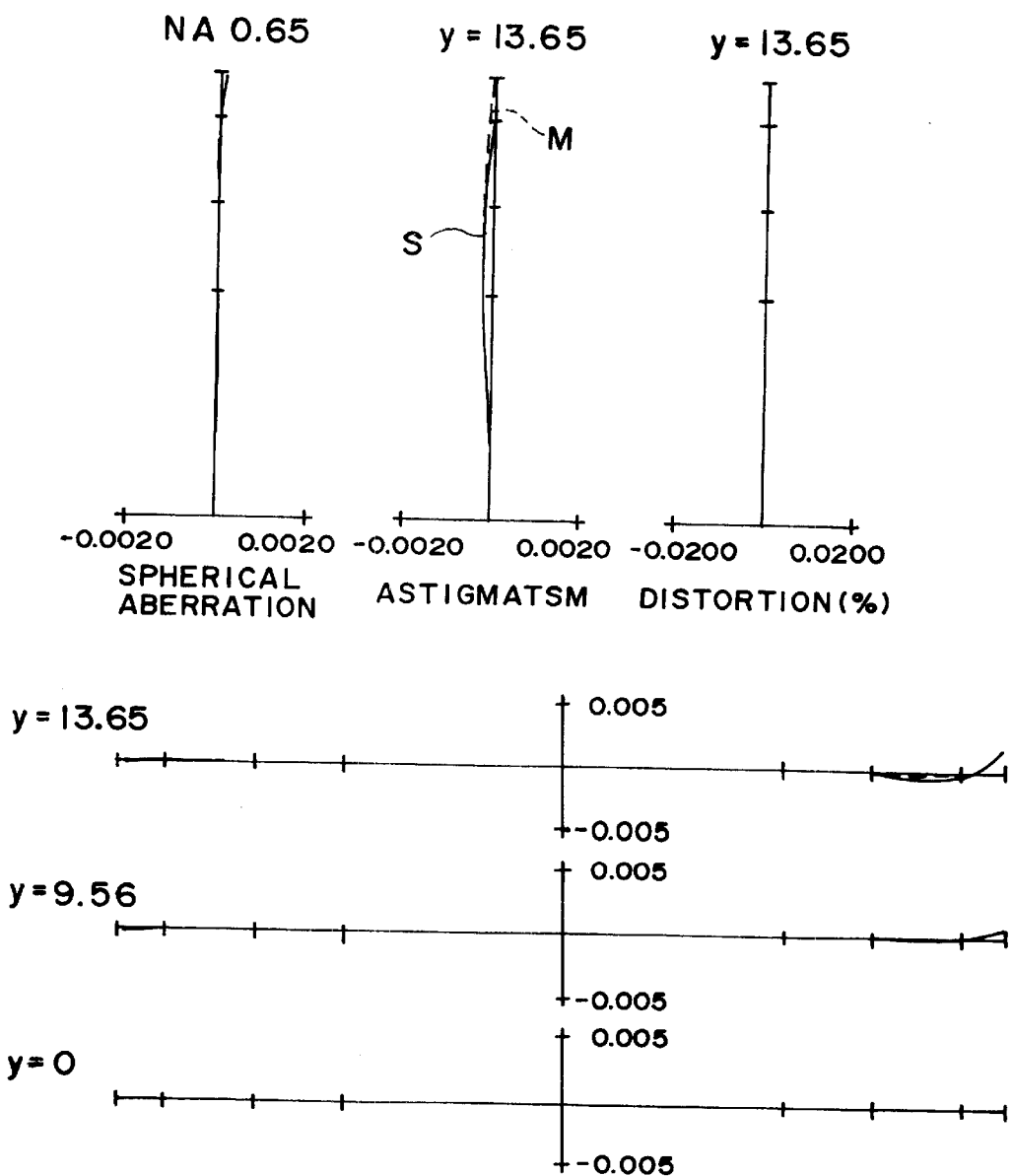
FIG. 12 illustrates aberrations of the projection optical system, in Numerical Example 6 of the present invention.

FIG. 11 is a sectional view of a lens system of a projection optical system, according to Numerical Example 6 of the present invention. FIG. 12 illustrates aberrations of the projection optical system, in Numerical Example 6 of the present invention.

Figure 13:
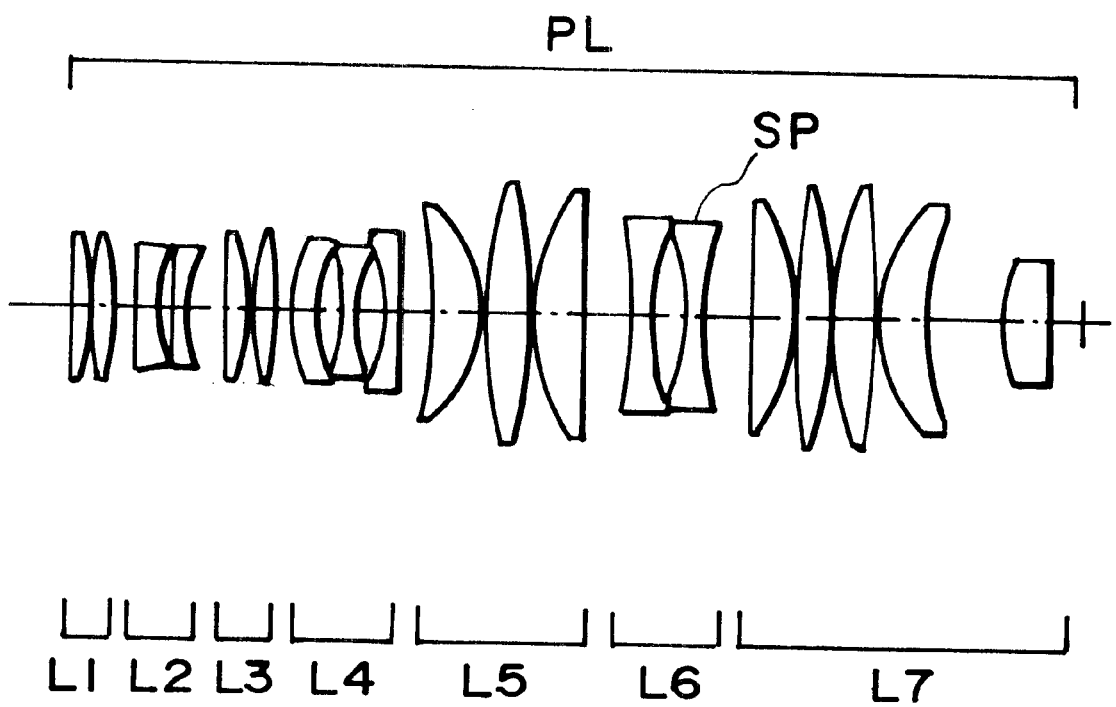
FIG. 13 is a sectional view of a lens system of a projection optical system, according to Numerical Example 7 of the present invention.
Figure 14:
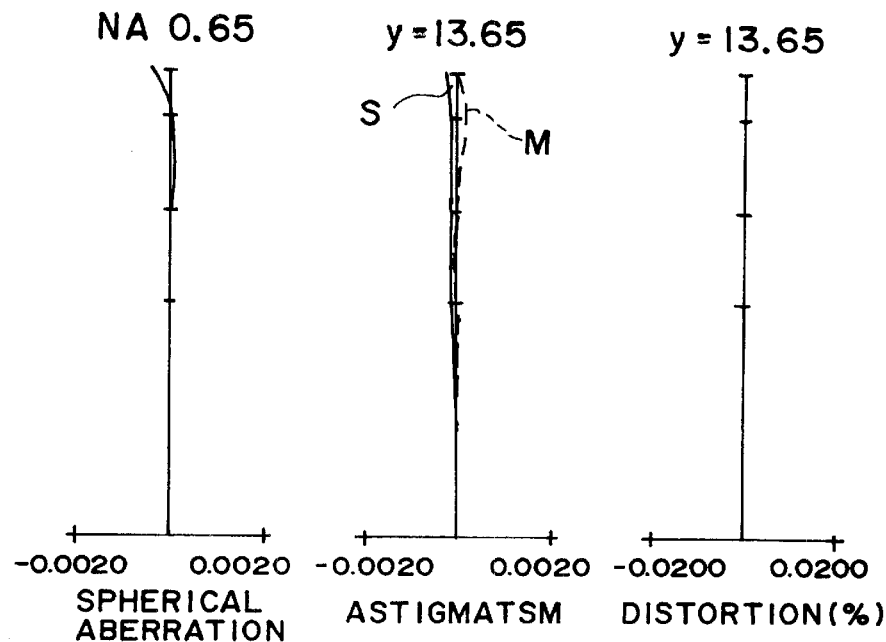
FIG. 14 illustrates aberrations of the projection optical system, in Numerical Example 7 of the present invention.
Figure 14:
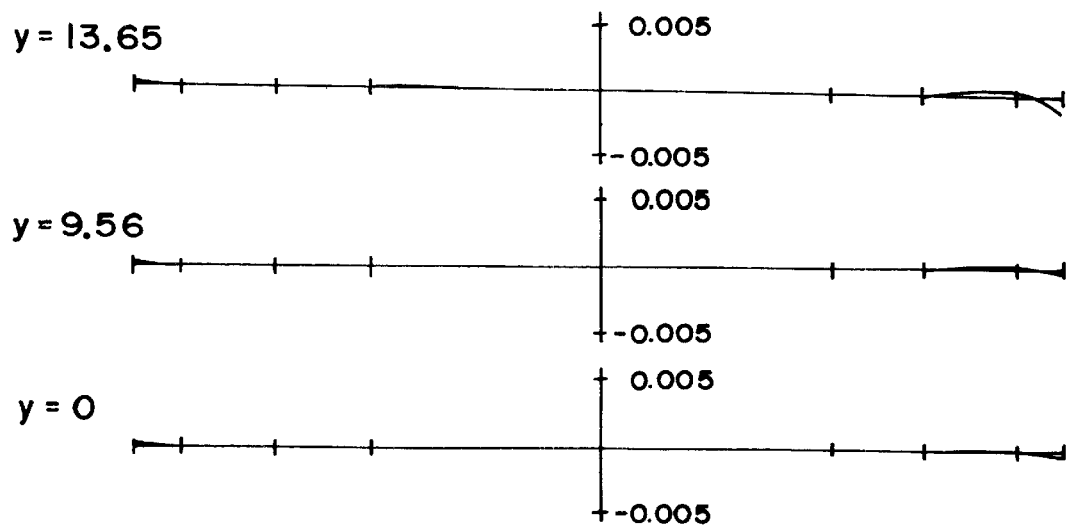

FIG. 13 is a sectional view of a lens system of a projection optical system, according to Numerical Example 7 of the present invention. FIG. 14 illustrates aberrations of the projection optical system, in Numerical Example 7 of the present invention.

In these lens sectional views, a reference character PL denotes a projection optical system, and a reference character Li denotes the i-th lens group (i-th group) in an order from the object side (conjugate side of longer distance).

Denoted at IP is an image plane which corresponds to a wafer surface, when the projection optical system is used in a projection exposure apparatus. Denoted at SP is a stop.

In these numerical examples, the projection optical system is made substantially telecentric on its object side (reticle side) and also on its image plane side (wafer side). The projection magnification is 1:4, and the numerical aperture (NA) on the image side is NA=0.65. The object-to-image distance or overall distance (from the object plane to the image plane) L is L=1000 mm. The reference wavelength is 193 nm. As regards the picture plane range, the exposure range upon a wafer surface is $\phi$=27.3 mm.

In Numerical Examples 1–7, the projection optical system has at least one aspherical surface. More specifically, it includes at least one aspherical surface lens having an aspherical surface formed on one side thereof, and a plane or flat surface formed on the other side thereof.

As regards a process for forming an aspherical surface lens which can meet a large diameter lens to be used in lithography or the like, an example is reported in "Computer-controlled polishing of telescope mirror segments", Robert A. Jones, OPTICAL ENGINEERING, March/April Vol. 22, No. 2, 1983. In this example, a three-dimensionally computer-controlled grinding machine is used to produce an aspherical surface shape and, thereafter, a computer-controlled polishing machine (CCP) is used to finish the same. A shape precision of 0.025$\lambda$rms ($\lambda$=633 nm) is reported.

Figure 15:
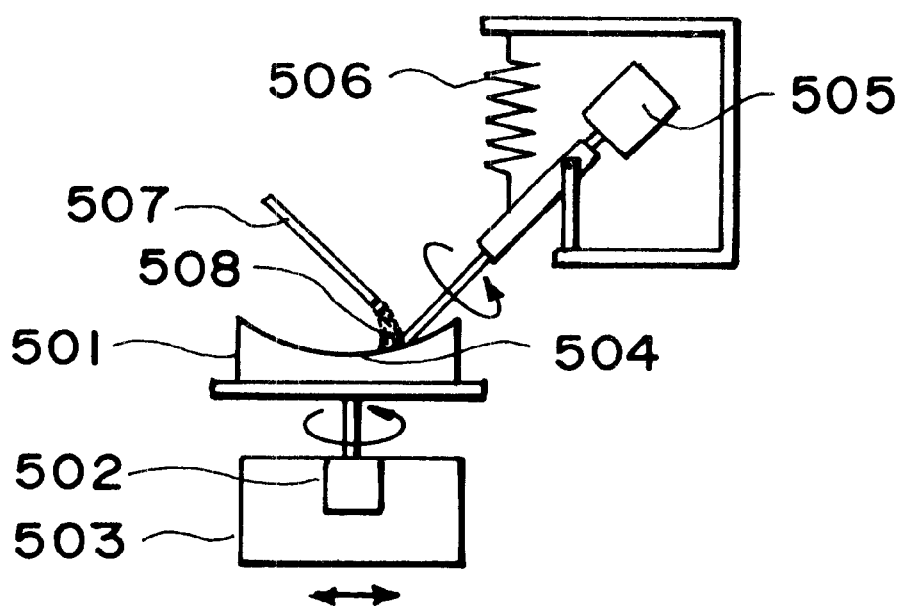
FIG. 15 is a schematic view for explaining a procedure for producing an aspherical surface.

FIG. 15 is a schematic view for explaining a procedure for making an aspherical surface by mechanical processings. Denoted in the drawing at 501 is a substrate, and denoted at 502 is a substrate rotating mechanism. Denoted at 503 is a stage, and denoted at 504 is a spherical surface pad. Denoted at 505 is a spherical surface pad rotating mechanism, and denoted at 506 is a load controlling mechanism. Denoted at 507 is a polishing liquid supplying nozzle, and denoted at 508 is a polishing liquid. The substrate 501 is rotatably mounted on the stage 503 which is movable, and the substrate can be rotated by the rotating mechanism 502.

The contact pressure to the surface of the substrate 501 being rotated is controlled by the load controlling mechanism 506. The spherical surface pad 405 being rotated by the pad rotating mechanism 505 contacts the surface of the substrate. The polishing liquid 508 is supplied to the contact surface by the liquid supplying mechanism 507, by which the contact surface is polished.

The position of the stage 503 and the contact pressure of the spherical pad 504 as applied by the load controlling mechanism 506 are controlled by a computer, not shown. With this procedure, an aspherical surface lens can be produced. However, the aspherical surface processing method is not limited to this, and any other method is usable.

An advantage of using a plane surface at a side (back side) opposite to a face where an aspherical surface is to be formed, is that, as compared with a case wherein a spherical surface is formed at the back side face, no special fixing tool is necessary in the manufacturing operations and also that the machining precision can be held high. Further, the time required for making a lens element (aspherical surface element) itself can be shortened, and the operation itself is easier. Additionally, when the lens element is incorporated into a lens system, its axial alignment and assembling adjustment are easier.

For the reasons described above, use of at least one aspherical surface element with a plane surface formed on its back side, into an optical system, is very advantageous with respect to ease in machining operations, reduction in cost, simplicity in assembling adjustment of a whole lens system, and so on.

All aspherical surface elements of a projection optical system may be provided by aspherical surface elements each having a plane surface on the back side thereof, opposite to the surface formed into an aspherical surface.

In order to assure that introduction of an aspherical surface effectively leads to a good imaging performance, the following relation should desirably be satisfied:

$$|\Delta ASPH/L| > 1 \times 10^{-6} \quad (1)$$

where $\Delta ASPH$ is the aspherical amount of the aspherical surface, and L is the object-to-image distance of the projection optical system.

Equation (1) defines a condition for aspherical amount. If the lower limit is exceeded, even if an aspherical surface is used to obtain a good imaging performance, the effect of the aspherical surface does not function well. For example, if the object-to-image distance is 1000 mm and the wavelength used is 193 nm, from equation (1), $\Delta ASPH$ is equal to 0.001 mm which corresponds to about ten Newton's rings.

This is a sufficiently large value as an aspherical surface to be used in a projection optical system. Further, for more effective use of an aspherical surface, the condition of equation (1) may preferably be changed to $$|\Delta ASPH/L| > 1 \times 10^{-5} \quad (1b)$$

to enlarge the aspherical amount.

Further, at least one of the following conditions may preferably be satisfied:

(a1) The projection optical system should include a plurality of lens groups including a positive refractive power lens group and a negative refractive power lens group, wherein a relation $$|L \times \phi_0| > 17 \quad (2)$$

is satisfied where L is an object-to-image distance and $\phi_0$ is the sum of powers of the negative lens group or groups.

(a2) The aspherical surface should be formed on a surface being in a range satisfying a relation, from the object side, $$|h_b/h| > 0.35 \quad (3)$$

where h is a height of an axial marginal light ray, and $h_b$ is a height of a most abaxial chief ray.

(a3) The aspherical surface should be formed on a surface satisfying a relation $$h_{ea}/h_{max} > 0.70 \quad (4)$$

where $h_{ea}$ is an effective diameter of the surface, and $h_{max}$ is a largest effective diameter of the projection optical system.

(a4) The following relation should be satisfied:

$$|\Delta ASPH/L| < 1.0 \times 0.2 \quad (1a)$$

(a5) The following relation should be satisfied:

$$|L \times \phi_0| < 70 \quad (2a)$$

(a6) The following relation should be satisfied:

$$|h_b/h| < 15 \quad (3a)$$

(a7) The aspherical surface should be formed on a surface satisfying a relation $$h_{ea}/h_{max} \leq 1.0 \quad (4a)$$

where $h_{ea}$ is an effective diameter of the surface, and $h_{max}$ is a largest effective diameter of the projection optical system.

In a projection optical system according to the present invention, in order that the power sharing in the whole optical system is set appropriately, the product of the object-to-image distance L of the lens system and the total power $\phi$ of the negative lens group (concave lens group) or groups is so determined as defined in the condition of equation (2).

Generally, if the object-to-image distance L becomes longer, the total power $\phi$ of the concave lens groups becomes smaller. If, on the other hand, the object-to-image distance becomes shorter, the total power $\phi$ of the concave lens groups becomes larger.

In one preferred form of the present invention, the product of them is set to be not less than 17. The power of the concave lens groups is therefore made larger, mainly for satisfactory correction of the curvature of image field and the astigmatism.

If the lower limit of the condition of equation (2) is exceeded, the Petzval sum increases in the positive direction, such that satisfactory correction of the curvature of image field or astigmatism becomes difficult to accomplish.

The condition of equation (3) defines an appropriate surface for introduction of an aspherical surface. In conventional reduction projection optical systems, it is very difficult to satisfactorily correct distortion, curvature of image field, and astigmatism as well as transverse aberrations of meridional and sagittal, while maintaining the telecentricity.

This is because of the following reason. The telecentricity, distortion, curvature of image field, and astigmatism are all aberration amounts related to a principal ray passing through the center of a light flux. Although these aberrations depend on the placement and shape of lenses on the object side where, in the lens system as a whole, the height of the principal ray is high, practically it is very difficult to maintain, on one hand, the telecentricity with respect to principal rays from every object point on the object and, on the other hand, to refract the same principal rays so as to correct the distortion, the curvature of image field and the astigmatism.

Further, since on a lens surface those rays below the meridional are refracted at a height still higher than the principal ray, it is difficult to balance the meridional transverse aberration and aberration concerning these principal rays. Simultaneously, in order to correct the curvature of image field which has a tendency that it is "under" with higher image height, usually a concave lens is used to refract the light strongly. Then, however, the peripheral portion (sagittal halo) of the sagittal transverse aberration at high image heights further changes "over". Thus, it is difficult to balance them satisfactorily.

Enlarging the numerical aperture and widening the exposure area under these situations directly lead to further enlargement of the object side light flux and image height, and it amplifies the difficulties in aberration correction.

In one preferred form of the present invention, in consideration of the above, the condition of equation (3) is satisfied and an aspherical surface is formed on such surface having a large influence to abaxial principal rays, thereby to concentratedly and effectively correct the above-described aberrations to be improved. This effectively reduces the load for correction of other aberrations, and accomplishes a good optical performance.

If the lower limit of the condition of equation (3) is exceeded, the influence to axial marginal light rays increases, rather than to the abaxial principal rays, and therefore, the effect of correcting the aberrations to be improved diminishes. Thus, it becomes difficult to attain an enlarged numerical aperture and a wider exposure area.

The condition of equation (4) defines the surface for introduction of an aspherical surface element having a flat surface on the side thereof opposite to the surface to be machined. When an aspherical surface is to be formed on a lens having a large effective diameter, not only is the machining operation difficult, but also the axial alignment and adjustment are not easy. Thus, by introducing an aspherical surface (element) having a flat surface at the back of the surface formed into an aspherical surface, and by forming the aspherical surface on such a surface as having a large ratio to the largest effective diameter of the optical system, so as to satisfy equation (4), the machining and adjustment of the aspherical surface lens can be made much easier. If the lower limit of the condition (4) is exceeded, the effective diameter of the surface where the aspherical surface is introduced becomes very small. Therefore, the advantageous effect described above reduces.

When the conditions of equations (1a)–(4a) mentioned above are not satisfied, satisfactory aberration correction becomes difficult to accomplish, like the conditions (1)–(4) described above.

If the upper limit of the condition of equation (1a) is exceeded, the power of a negative lens group or groups having a negative refractive power becomes too strong. Therefore, the Petzval sum is over-corrected, and it becomes difficult to mainly correct the curvature of image field and astigmatism, satisfactorily.

Further, the lens diameter of a positive lens group having a positive refractive power becomes larger, or the number of lenses increases.

If the upper limit of the condition of equation (2a) is exceeded, lenses become too close to the object plane and the working distance cannot be kept. If the magnification of the projection optical system is extraordinarily small, the working distance may be kept even though the condition is exceeded. However, an optical system having such an extraordinarily small magnification is not practical for use in lithography.

When the upper limit of the condition of equation (3a) is exceeded, the aspherical amount becomes too large, causing a large increase in the time necessary for lens machining. Further, higher order aberrations produced at the aspherical surface become strong, which makes the satisfactory correction of aberration very difficult.

Important features of numerical examples of a projection optical system, according to the present invention, will now be described.

A projection optical system according to Numerical Example 1 shown in FIG. 1 includes, in an order from the object side, a first lens group L1 having a positive refractive power, a second lens group L2 having a negative refractive power, a third lens group L3 having a positive refractive power and a fourth lens group L4 having a positive refractive power.

The first lens group L1 comprises, in an order from the object side, an aspherical surface negative lens having a plane-concave shape with its concave surface facing to the image side, a positive lens of biconvex shape, an aspherical surface positive lens of plane-convex shape with its convex surface facing to the object side, and two positive lenses of meniscus shape with its convex surface facing to the object side. A negative lens is placed closest to the object side, and four positive lenses are placed after it. Thus, a retro-focus type system is provided.

With the arrangement described above, the spacing between the object plane and the first surface of the first lens group L1 is effectively shortened, and the optical system is made compact. Also, deterioration of astigmatism and curvature of image field is corrected.

A negative lens is placed inside the first lens group L1, by which a good symmetry with the fourth lens group L4 is accomplished, and the distortion aberration is corrected satisfactorily. The aspherical surfaces are used mainly to correct distortion and astigmatism satisfactorily.

The second lens group L2 comprises three negative lenses which are, in an order from the object side, an aspherical surface negative lens of plane-concave shape with its concave surface facing to the object side, a negative lens of biconcave shape, and an aspherical surface negative lens of plane-concave shape with its concave surface facing to the object side.

By using plural negative lenses as in this example, the Petzval sum can be corrected satisfactorily. Also, with use of aspherical surface lenses, mainly astigmatism and spherical aberration in the second lens group L2 having a strong negative power are corrected.

The third lens group L3 has a positive refractive power so as to transform a divergent light flux from the second lens group L2 into a convergent light flux or one close to a parallel light flux. In an order from the object side, it comprises a positive lens of biconvex shape, an aspherical surface positive lens of biconvex shape, and a positive lens of biconvex shape.

Due to the strong positive refractive power of this third lens group L3, the incidence height of light rays to the fourth lens group L4 can be suppressed, such that production of higher order aberrations at the fourth lens group L4 can be reduced. Also, the refractive power of the second lens group may be made stronger, and on that occasion, correction of the curvature of field can be done by the second lens group L2 satisfactorily. Because of the strong refractive power of the third lens group L3, a strong negative aberration is produced. In order to correct the same, aspherical surfaces are introduced.

The fourth lens group L4 has a positive refractive power to provide a telecentric optical system on the image side. In an order from the object side, it comprises an aspherical positive lens of plane-convex shape with its convex surface facing to the object side, a positive lens of meniscus shape with its convex surface facing to the object side, an aspherical positive lens of meniscus shape with its concave surface facing to the image side, a positive lens of meniscus shape with its convex surface facing to the object side, an aspherical negative lens of plane-concave shape with its concave surface facing to the image side, and an aspherical positive lens of plane-convex shape with its convex surface facing to the object side.

The aspherical surfaces are defined so as to assure sufficient correction of spherical aberration and coma particularly with respect to light of NA=0.65. Also, by disposing an aspherical surface close to the image plane, distortion and coma can be corrected satisfactorily.

This example uses seven aspherical lenses each having a plane surface at a side opposite to the surface where an aspherical surface is formed, as well as two aspherical lenses each having a spherical surface at a side opposite to the surface where an aspherical surface is formed.

A projection optical system according to Numerical Example 2 shown in FIG. 3 has a structure which differs from Numerical Example 1 of FIG. 1 in that all aspherical surface lenses have a flat surface at the back of the aspherical surface, and that a first lens group L1 thereof comprises, in an order from the object side, an aspherical surface negative lens of plane-concave shape with its concave surface facing to the image side, a positive lens of meniscus shape with its concave surface facing to the object side, a positive lens of biconvex shape, and an aspherical surface positive lens of plane-convex shape with its convex surface facing to the object side.

The second lens group L2 comprises four negative lenses which are, in an order from the subject side, a negative lens of meniscus shape with its concave surface facing to the image side, an aspherical negative lens of plane-concave shape with its concave surface facing to the image side, a negative lens of biconcave shape, and a negative lens of meniscus shape with its concave surface facing to the object side.

The second lens group L2 is made to provide a shorter focal length to assure better correction of the Petzval sum. Also, the third lens group L3 comprises, in an order from the object side, a positive lens of meniscus shape with its convex surface facing to the image side, an aspherical surface positive lens of plane-convex shape with its convex surface facing to the image side, and a positive lens of biconvex shape.

The fourth lens group L4 comprises, in an order from the object side, two aspherical surface positive lenses of plane-convex shape with their convex surfaces facing to the object side, two positive lenses of meniscus shape with their concave surfaces facing to the image side, a negative lens with a concave surface facing to the image side, and an aspherical surface positive lens of plane-convex shape with its convex surface facing to the object side.

A projection optical system according to Numerical Example 3 shown in FIG. 5 includes, in an order from the object side, a first lens group L1 having a positive refractive power, a second lens group L2 having a negative refractive power, a third lens group L3 having a positive refractive power, a fourth lens group L4 having a negative refractive power, a fifth lens group L5 having a positive refractive power, and a sixth lens group L6 having a positive refractive power.

The lens structure of Numerical Example 3 differs from Numerical Examples 1 and 2 in that there are two strong negative lens groups disposed in the optical system.

The first lens group L1 comprises, in an order from the object side, a positive lens of plane-convex shape with its convex surface facing to the image side, and an aspherical surface positive lens of plane-convex shape with its convex surface facing to the object side. By using an aspherical surface, it is assured mainly to correct distortion aberration, for example, satisfactorily while maintaining the telecentricity.

The second lens group L2 comprises, in an order from the object side, a negative lens of meniscus shape with its concave surface facing to the image side, an aspherical surface negative lens of plane-concave shape with its concave surface facing to the image side, and a negative lens of biconcave shape.

The second lens group L2 and the fourth lens group L4 function mainly to correct the Petzval sum.

The third lens group L3 comprises, in an order from the object side, an aspherical surface positive lens of plane-convex shape with its convex surface facing to the image side, and two positive lenses of biconvex shape. The fourth lens group L4 comprises, in an order from the object side, an aspherical surface negative lens of plane-concave shape with its concave surface facing to the image side, and a negative lens of biconcave shape. Use of the aspherical surfaces is effective to correct sagittal coma flare, for example, satisfactorily. The fifth lens group L5 comprises, in an order from the object side, an aspherical surface positive lens of plane-convex shape with its convex surface facing to the image side, and a positive lens of biconvex shape.

Strong negative aspherical aberration to be produced by this lens group is corrected mainly by the aspherical surface. The sixth lens group L6 comprises, in an order from the object side, an aspherical surface positive lens of plane-convex shape with its convex surface facing to the object side, a positive lens of meniscus shape with its concave surface facing to the image side, a lens of meniscus shape with its concave surface facing to the image side, and an aspherical surface lens of meniscus shape with its concave surface facing to the image side. The aspherical surface at the last surface functions mainly to correct the balance of coma and distortion satisfactorily.

This example uses six aspherical surface lenses each having a plane surface at the back of the surface formed into an aspherical surface, as well as one lens having a plane surface at the back of the surface formed into an aspherical surface.

A projection optical system according to Numerical Example 4 shown in FIG. 7 includes, in an order from the object side, a first lens group L1 having a positive refractive power, a second lens group L2 having a negative refractive power, a third lens group L3 having a positive refractive power, a fourth lens group L4 having a negative refractive power, and a fifth lens group L5 having a positive refractive power.

Numerical Example 4 differs from Numerical Examples 1 and 2 in that there are two strong negative lenses placed in the optical system, as Numerical Example 3. As compared with Numerical Example 3, the power arrangement is made such that the first lens group L1 has a longer focal distance and the lateral magnification of the third lens group L3 is made closer to a unit magnification (−1×).

More specifically, the first lens group L1 comprises, in an order from the object side, an aspherical surface positive lens of biconvex shape, a negative lens of meniscus shape with its concave surface facing to the image side, and a positive lens of biconvex shape. The second lens group L2 comprises, in an order from the object side, a negative lens of meniscus shape with its concave surface facing to the image plane, an aspherical surface negative lens of plane-concave shape with its concave surface facing to the image plane, and a negative lens of biconcave shape. The third lens group L3 comprises, in an order from the object side, a positive lens of plane-convex shape with its convex surface facing to the image side, and three positive lenses of biconvex shape.

The fourth lens group L4 comprises a negative lens of biconcave shape, and an aspherical surface negative lens of biconcave shape. The fifth lens group L5 comprises, in an order from the object side, an aspherical surface positive lens of plane-convex shape with its convex surface facing to the image side, a positive lens of biconvex shape, an aspherical surface positive lens of plane-convex shape with its convex surface facing to the object side, two positive lenses of meniscus shape with their concave surfaces facing to the image side, a negative lens of meniscus shape with its concave surface facing to the image side, and an aspherical surface positive lens of plane-convex shape with its convex surface facing to the object side.

This example uses five aspherical surface lenses each having a plane surface at a side opposite to the surface where an aspherical surface is formed, as well as two lenses each having a spherical surface at the back of the surface where an aspherical surface is formed.

A projection optical system according to Numerical Example 5 shown in FIG. 9 differs from Numerical Example 3 of FIG. 5 only in that all aspherical surface lenses have a plane surface at a side opposite to the surface where an aspherical surface is formed. As regards the group structure, it comprises six groups like Numerical Example 3, but its specific lens structure differs.

Particularly, the second lens group L2 comprises, in an order from the object side, an aspherical surface negative lens of plane-concave shape with its concave surface facing to the image side, and a negative lens of biconcave shape. The third lens group L3 comprises, in an order from the object side, an aspherical surface lens of plane-convex shape with its convex surface facing to the image side, two positive lenses of biconvex shape, and a positive meniscus lens with its concave surface facing to the image side.

Further, the sixth lens group L6 comprises, in an order from the object side, an aspherical surface positive lens of plane-convex shape with its convex surface facing to the object side, a positive lens of biconvex shape, and a positive meniscus lens with its concave surface facing to the image side.

A projection optical system according to Numerical Example 6 shown in FIG. 11 includes, in an order from the object side, a first lens group L1 having a positive refractive power, a second lens group L2 having a negative refractive power, a third lens group L3 having a positive refractive power, a fourth lens group L4 having a negative refractive power, a fifth lens group L5 having a positive refractive power, a sixth lens group L6 having a negative refractive power, and a seventh lens group L7 having a positive refractive power.

The lens structure of Numerical Example 6 differs from Numerical Examples 1–5 in that there are three strong negative lens groups disposed in the optical system. With this arrangement, the refractive power of a lens group having a negative refractive power is dispersed to assure satisfactory correction of the Petzval sum.

The first lens group L1 comprises, in an order from the object side, an aspherical surface positive lens of plane-convex shape with its convex surface facing to the image side, and a positive lens of biconvex shape. The second lens group L2 comprises, in an order from the object side, a negative lens of biconcave shape, and an aspherical surface negative lens of plane-concave shape with its concave surface facing to the image side. The third lens group L3 comprises, in an order from the object side, an aspherical surface positive lens of plane-convex shape with its convex surface facing to the image side, and a positive lens of biconvex shape.

The fourth lens group L4 comprises, in an order from the object side, a negative lens of biconcave shape, and an aspherical surface negative lens of plane-concave shape with its concave surface facing to the object side. The fifth lens group L5 comprises, in an order from the object side, an aspherical surface positive lens of plane-convex shape with its convex surface facing to the image side, and two positive lenses of biconvex shape. The sixth lens group L6 comprises, in an order from the object side, a negative lens of biconcave shape, and an aspherical surface negative lens of plane-concave shape with its concave surface facing to the object side.

The seventh lens group L7 comprises, in an order from the object side, a positive lens of plane-convex shape with its convex surface facing to the image side, an aspherical surface positive lens of plane-convex shape with its convex surface facing to the image side, a positive lens of biconvex shape, a positive lens of plane-convex shape with its convex surface facing to the object side, a positive lens of meniscus shape with its concave surface facing to the image side, a negative lens of biconcave shape, and an aspherical surface positive lens of plane-convex shape with its convex surface facing to the object side.

In this example, all the aspherical surface lenses have a plane surface at a side opposite to the face where an aspherical surface is formed.

A projection optical system according to Numerical Example 7 shown in FIG. 13 has seven lens groups as in Numerical Example 6, but the specific lens structure differs. The second lens group L2 comprises, in an order from the object side, two aspherical surface negative lenses of plane-concave shape with their concave surfaces facing to the image side.

Further, the fourth lens group L4 comprises, in an order from the object side, a negative lens of meniscus shape with its concave surface facing to the image side, a negative lens of biconcave shape, and an aspherical surface negative lens of plane-concave shape with its concave surface facing to the object side. The fifth lens group L5 comprises, in an order from the object side, a positive lens of meniscus shape with its concave surface facing to the object side, a positive lens of biconvex shape, and an aspherical surface positive lens of plane-convex shape with its convex surface facing to the object side.

The sixth lens group L6 comprises two negative lenses of biconcave shape. Further, the seventh lens group L7 comprises, in an order from the object side, an aspherical surface positive lens of plane-convex shape with its convex surface facing to the image side, two positive lenses of biconvex shape, a positive lens of meniscus shape with its concave surface facing to the image side, and an aspherical surface positive lens of plane-convex shape with its convex surface facing to the object side.

All the aspherical surface lenses used in Numerical Examples 6 and 7 have a plane surface at a side opposite to the face where an aspherical surface is formed. However, it is not always necessary to make all these surfaces flat.

In the numerical examples described above, the conical constant k concerning the aspherical surface shape is taken as zero. However, the design may be made while taking the conical constant as a variable.

Further, in these examples, silica is used as a lens glass material. However, fluorite may be used. When both silica and fluorite are used, chromatic aberration can be corrected to be very small. Of course, only fluorite may be used.

In these examples, the exposure light source uses ArF wavelength of 193 nm. However, KrF wavelength or any other wavelength such as $F_2$ laser wavelength, for example, may be used.

While the present invention has been described with reference to some specific examples of optical systems, the present invention is not limited to them. Any optical system having an aspherical surface lens with a plane surface at a side opposite to a face where an aspherical surface is formed, may be provided by the present invention.

As described hereinbefore, use of an aspherical surface or surfaces effectively accomplishes an optical system having a significantly reduced number of lenses and still having a very high numerical aperture. Further, each aspherical surface element has a plane surface on the side opposite to the face where an aspherical surface is formed, and this directly contributes to an aspherical surface projection optical system of easy manufacture and easy adjustment.

Next, structural specifications of these numerical examples will be described. In the numerical example data to be described below, "ri" refers to the curvature radius of the i-th lens surface, in an order from the object side, and "di" refers to the i-th lens thickness or air spacing, in an order from the object side. Further, "Ni" refers to the refractive index of the glass material of the i-th lens lens, in an order from the object side. Here, the refractive index of silica with respect to the exposure wavelength 193 nm is 1.5602.

The shape of an aspherical surface can be given by the following equation:

$$X = \frac{H^2/ri}{1 + \{1 - (1+k) \cdot (H/ri)^2\}^{1/2}} + A \cdot H^4 + B \cdot H^6 + C \cdot H^8 + D \cdot H^{10} + E \cdot H^{12} + F \cdot H^{14} + G \cdot H^{16} + \ldots$$

where X is the displacement amount in the optical axis direction from the lens vertex, H is the distance from the optical axis, ri is the curvature radius, k is the conical constant, and A, B, C, . . . , G are aspherical coefficients.

The following is numerical data for Numerical Examples 1–7. Also, Tables 1–7 below show the relation between the conditions described above and these numerical examples.

| [Numerical Example 1] | | | | |
|---|---|---|---|---|
| i | ri | di | ni | Obj-distance = 70.000 |
| 1 | 0.000 | 11.000 | 1.56020 | |
| 2 | 241.465 | 56.884 | | |
| 3 | 267.828 | 25.258 | 1.56020 | |

-continued

| | | | |
|---|---|---|---|
| 4 | −2696.927 | 22.315 | |
| 5 | 355.072 | 19.305 | 1.56020 |
| 6 | 0.000 | 1.048 | |
| 7 | 154.997 | 29.861 | 1.56020 |
| 8 | 982.874 | 18.031 | |
| 9 | 166.757 | 21.426 | 1.56020 |
| 10 | 237.897 | 43.147 | |
| 11 | −132.031 | 11.000 | 1.56020 |
| 12 | 0.000 | 13.161 | |
| 13 | −127.448 | 11.000 | 1.56020 |
| 14 | 112.752 | 30.387 | |
| 15 | −130.280 | 14.551 | 1.56020 |
| 16 | 0.000 | 16.100 | |
| 17 | 2738.653 | 17.304 | 1.56020 |
| 18 | −355.680 | 57.482 | |
| 19 | 628.158 | 35.237 | 1.56020 |
| 20 | −279.154 | 5.005 | |
| 21 | 767.583 | 21.509 | 1.56020 |
| 22 | −814.760 | 78.543 | |
| 23 | 0.0(stop) | 129.473 | |
| 24 | 401.982 | 22.130 | 1.56020 |
| 25 | 0.000 | 1.647 | |
| 26 | 231.031 | 37.985 | 1.56020 |
| 27 | 2335.067 | 2.206 | |
| 28 | 216.165 | 29.443 | 1.56020 |
| 29 | 616.097 | 3.999 | |
| 30 | 142.250 | 41.935 | 1.56020 |
| 31 | 441.153 | 12.344 | |
| 32 | 0.000 | 13.525 | 1.56020 |
| 33 | 174.747 | 6.283 | |
| 34 | 369.487 | 33.703 | 1.56020 |
| 35 | 0.000 | | | aspherical surfaces

| i | K | A | B | C | D |
|---|---|---|---|---|---|
| 2 | 0.000000e + 000 | −1.169489e − 007 | 5.521468e − 012 | −1.313218e − 016 | 1.023595e − 020 |
| 5 | 0.000000e + 000 | 7.740697e − 009 | 1.228082e − 012 | 1.550282e − 017 | −6.688531e − 022 |
| 11 | 0.000000e + 000 | −6.762574e − 008 | 1.295253e − 011 | 1.273198e − 015 | −1.120656e − 019 |
| 15 | 0.000000e + 000 | −5.704610e − 008 | −1.735874e − 012 | 3.590224e − 016 | −3.791498e − 020 |
| 20 | 0.000000e + 000 | 1.749556e − 008 | 2.878338e − 013 | −1.238659e − 019 | −1.863774e − 022 |
| 24 | 0.000000e + 000 | −1.202552e − 008 | −1.845670e − 013 | 7.926570e − 018 | −1.467677e − 022 |
| 28 | 0.000000e + 000 | 4.480818e − 009 | 1.806535e − 013 | −1.700337e − 017 | −1.029084e − 022 |
| 33 | 0.000000e + 000 | 1.562171e − 009 | 2.601211e − 012 | −8.165480e − 016 | −7.681084e − 020 |
| 34 | 0.000000e + 000 | 8.993015e − 009 | 1.089272e − 011 | −1.330430e − 015 | −7.492539e − 020 |

| i | E | F | G |
|---|---|---|---|
| 2 | −1.793948e − 026 | 0.000000e + 000 | 0.000000e + 000 |
| 5 | −4.046791e − 026 | 0.000000e + 000 | 0.000000e + 000 |
| 11 | 1.475317e − 023 | 0.000000e + 000 | 0.000000e + 000 |
| 15 | 4.268750e − 023 | 0.000000e + 000 | 0.000000e + 000 |
| 20 | 1.950744e − 027 | 0.000000e + 000 | 0.000000e + 000 |
| 24 | 1.190929e − 027 | 0.000000e + 000 | 0.000000e + 000 |
| 28 | −1.669734e − 026 | 0.000000e + 000 | 0.000000e + 000 |
| 33 | −3.567106e − 023 | 0.000000e + 000 | 0.000000e + 000 |
| 34 | −1.577428e − 023 | 0.000000e + 000 | 0.000000e + 000 |

[Numerical Example 2]
Object to First Surface Distance: 78.337 mm

| i | ri | di | ni |
|---|---|---|---|
| 1 | 0.000 | 11.000 | 1.56020 |
| 2 | 291.960 | 13.576 | |
| 3 | −2468.391 | 18.430 | 1.56020 |
| 4 | −212.937 | 2.174 | |
| 5 | 632.275 | 36.661 | 1.56020 |
| 6 | −195.510 | 1.716 | |
| 7 | 209.897 | 30.803 | 1.56020 |
| 8 | 0.000 | 10.964 | |
| 9 | 179.370 | 11.379 | 1.56020 |
| 10 | 85.411 | 36.359 | |
| 11 | 0.000 | 9.310 | 1.56020 |
| 12 | 137.526 | 70.188 | |
| 13 | −94.815 | 9.310 | 1.56020 |
| 14 | 354.874 | 22.479 | |
| 15 | −94.483 | 10.344 | 1.56020 |

-continued

| i | ri | di | ni |
|---|---|---|---|
| 16 | −819.857 | 20.429 | |
| 17 | −1867.588 | 33.299 | 1.56020 |
| 18 | −217.001 | 1.000 | |
| 19 | 0.000 | 40.000 | 1.56020 |
| 20 | −234.059 | 1.000 | |
| 21 | 477.242 | 37.938 | 1.56020 |
| 22 | −515.192 | 86.709 | |
| 23 | 0.0(stop) | 120.402 | |
| 24 | 298.270 | 48.200 | 1.56020 |
| 25 | 0.000 | 11.574 | |
| 26 | 275.687 | 36.978 | 1.56020 |
| 27 | 0.000 | 10.799 | |
| 28 | 203.097 | 32.137 | 1.56020 |
| 29 | 533.727 | 2.293 | |
| 30 | 186.253 | 28.417 | 1.56020 |
| 31 | 1013.907 | 5.512 | |
| 32 | 1325.581 | 18.749 | 1.56020 |
| 33 | 107.474 | 22.379 | |
| 34 | 180.126 | 18.257 | 1.56020 |
| 35 | 0.000 | | | aspherical surfaces

| i | K | A | B | C | D |
|---|---|---|---|---|---|
| 2 | 0.000000e + 000 | 3.736230e − 008 | 1.038222e − 012 | −3.965564e − 016 | −5.505777e − 021 |
| 7 | 0.000000e + 000 | 4.848022e − 009 | 4.158133e − 012 | 1.071518e − 016 | −9.266750e − 021 |
| 12 | 0.000000e + 000 | −1.028517e − 007 | 1.142371e − 011 | 1.548505e − 015 | 3.030974e − 019 |
| 20 | 0.000000e + 000 | 2.096099e − 008 | 3.467669e − 013 | 2.256954e − 018 | −4.666722e − 023 |
| 24 | 0.000000e + 000 | −3.621224e − 009 | −5.579396e − 013 | 7.419379e − 018 | −3.142413e − 022 |
| 26 | 0.000000e + 000 | −2.374654e − 008 | 3.141420e − 013 | −2.583907e − 018 | 8.955907e − 023 |
| 34 | 0.000000e + 000 | 6.812835e − 008 | 5.847001e − 012 | −1.362069e − 017 | 8.105142e − 020 |

| i | E | F | G |
|---|---|---|---|
| 2 | 3.907528e − 024 | −2.229541e − 028 | 0.000000e + 000 |
| 7 | 7.709364e − 025 | −4.176635e − 029 | 0.000000e + 000 |
| 12 | −8.699782e − 024 | 1.590852e − 026 | 0.000000e + 000 |
| 20 | −1.190790e − 027 | 8.053524e − 032 | 0.000000e + 000 |
| 24 | 7.943315e − 027 | −9.396981e − 032 | 0.000000e + 000 |
| 26 | −8.404456e − 027 | 7.322317e − 032 | 0.000000e + 000 |
| 34 | −1.014027e − 023 | 8.198208e − 028 | 0.000000e + 000 |

[Numerical Example 3]
Object to First Surface Distance: 98.214 mm

| i | ri | di | ni |
|---|---|---|---|
| 1 | 0.000 | 35.283 | 1.56020 |
| 2 | −202.253 | 1.000 | |
| 3 | 196.472 | 21.687 | 1.56020 |
| 4 | 0.000 | 1.000 | |
| 5 | 163.840 | 20.913 | 1.56020 |
| 6 | 108.642 | 18.007 | |
| 7 | 0.000 | 11.000 | 1.56020 |
| 8 | 142.097 | 21.663 | |
| 9 | −196.412 | 11.000 | 1.56020 |
| 10 | 211.337 | 68.733 | |
| 11 | 0.000 | 26.757 | 1.56020 |
| 12 | −223.854 | 1.000 | |
| 13 | 693.208 | 33.377 | 1.56020 |
| 14 | −259.524 | 1.000 | |
| 15 | 349.600 | 29.343 | 1.56020 |
| 16 | −488.748 | 59.415 | |
| 17 | 0.000 | 11.000 | 1.56020 |
| 18 | 177.628 | 22.570 | |
| 19 | −171.815 | 11.000 | 1.56020 |
| 20 | 148.088 | 96.964 | |
| 21 | 0.0(stop) | 31.152 | |
| 22 | 0.000 | 25.233 | 1.56020 |
| 23 | −283.913 | 8.408 | |
| 24 | 274.841 | 38.513 | 1.56020 |
| 25 | −1832.307 | 100.711 | |
| 26 | 239.348 | 33.950 | 1.56020 |
| 27 | 0.000 | 1.033 | |
| 28 | 169.199 | 32.449 | 1.56020 |
| 29 | 540.334 | 1.000 | |
| 30 | 120.352 | 44.300 | 1.56020 |
| 31 | 86.480 | 3.768 | |

-continued

| | | | |
|---|---|---|---|
| 32 | 93.410 | 41.306 | 1.56020 |
| 33 | 100.526 | | | aspherical surfaces

| i | K | A | B | C | D |
|---|---|---|---|---|---|
| 3 | 0.000000e + 000 | 3.650790e − 008 | −9.230325e − 013 | 5.957551e − 017 | −2.805723e − 020 |
| 8 | 0.000000e + 000 | 1.769184e − 077 | 1.795818e − 012 | −3.786678e − 016 | −3.120635e − 019 |
| 12 | 0.000000e + 000 | −1.662398e − 009 | 1.085256e − 013 | −3.042158e − 018 | 7.706400e − 022 |
| 18 | 0.000000e + 000 | −1.731542e − 008 | −4.620024e − 012 | −2.904976e − 016 | −2.146101e − 020 |
| 23 | 0.000000e + 000 | 9.562980e − 009 | 1.835166e − 013 | 4.699629e − 018 | 1.232888e − 022 |
| 26 | 0.000000e + 000 | −5.523449e − 009 | −4.344737e − 013 | −4.397292e − 018 | −1.896027e − 022 |
| 33 | 0.000000e + 000 | 2.159918e − 007 | 1.616246e − 011 | 8.393394e − 016 | −2.980107e − 018 |

| i | E | F | G |
|---|---|---|---|
| 3 | 4.592119e − 024 | −2.738347e − 028 | 0.000000e + 000 |
| 8 | 7.179478e − 023 | −7.666732e − 027 | 0.000000e + 000 |
| 12 | −3.545587e − 026 | 3.177747e − 030 | 0.000000e + 000 |
| 18 | −1.843132e − 025 | −3.621190e − 028 | 0.000000e + 000 |
| 23 | −1.671856e − 027 | 1.331041e − 031 | 0.000000e + 000 |
| 26 | 1.392972e − 027 | −2.305348e − 031 | 0.000000e + 000 |
| 33 | 7.162464e − 022 | −2.675240e − 025 | 0.000000e + 000 |

[Numerical Example 4]
Object to First Surface Distance: 98.335 mm

| i | ri | di | ni |
|---|---|---|---|
| 1 | 258.389 | 25.051 | 1.56020 |
| 2 | −327.861 | 1.000 | |
| 3 | 243.444 | 15.030 | 1.56020 |
| 4 | 121.667 | 5.872 | |
| 5 | 156.030 | 27.875 | 1.56020 |
| 6 | −367.265 | 25.809 | |
| 7 | 793.456 | 11.992 | 1.56020 |
| 8 | 89.933 | 18.007 | |
| 9 | 0.000 | 11.000 | 1.56020 |
| 10 | 130.546 | 26.661 | |
| 11 | −126.980 | 11.000 | 1.56020 |
| 12 | 307.162 | 58.440 | |
| 13 | 0.000 | 30.020 | 1.56020 |
| 14 | −261.428 | 1.000 | |
| 15 | 2554.137 | 33.056 | 1.56020 |
| 16 | −292.110 | 1.000 | |
| 17 | 645.624 | 46.291 | 1.56020 |
| 18 | −416.972 | 1.000 | |
| 19 | 247.116 | 40.239 | 1.56020 |
| 20 | −1197.155 | 54.915 | |
| 21 | −386.847 | 17.501 | 1.56020 |
| 22 | 189.909 | 47.424 | |
| 23 | −194.762 | 11.000 | 1.56020 |
| 24 | 219.967 | 30.054 | |
| 25 | 0.0(stop) | 37.914 | |
| 26 | 0.000 | 42.305 | 1.56020 |
| 27 | −241.071 | 10.245 | |
| 28 | 667.942 | 33.531 | 1.56020 |
| 29 | −478.335 | 7.234 | |
| 30 | 321.575 | 29.811 | 1.56020 |
| 31 | 0.000 | 1.000 | |
| 32 | 167.894 | 39.660 | 1.56020 |
| 33 | 616.843 | 1.000 | |
| 34 | 142.661 | 35.259 | 1.56020 |
| 35 | 408.323 | 11.006 | |
| 36 | 1053.323 | 11.000 | 1.56020 |
| 37 | 90.505 | 14.026 | |
| 38 | 123.082 | 23.218 | 1.56020 |
| 39 | 0.000 | | | aspherical surfaces

| i | K | A | B | C | D |
|---|---|---|---|---|---|
| 2 | 0.000000e + 000 | 2.839128e − 008 | −7.216111e − 013 | 1.446883e − 017 | 8.209235e − 021 |
| 10 | 0.000000e + 000 | −8.396863e − 008 | −3.967152e − 012 | −4.351418e − 016 | −6.730147e − 019 |
| 14 | 0.000000e + 000 | 1.580736e − 009 | 6.621529e − 014 | 4.355724e − 018 | 5.471514e − 022 |
| 23 | 0.000000e + 000 | −1.724710e − 008 | 3.359733e − 012 | 1.509594e − 017 | −1.522094e − 021 |
| 27 | 0.000000e + 000 | 4.103452e − 009 | 1.774471e − 013 | −4.246034e − 018 | 3.532934e − 022 |

-continued

| | | | | |
|---|---|---|---|---|
| 30 0.000000e + 000 | −8.160064e − 010 | −4.350079e − 014 | −4.600384e − 018 | 1.998185e − 022 |
| 38 0.000000e + 000 | 1.998305e − 008 | −3.081108e − 012 | −3.679832e − 016 | 5.352264e − 020 |

| i | E | F | G |
|---|---|---|---|
| 2 | −1.716217e − 024 | 1.017359e − 028 | 0.000000e + 000 |
| 10 | 1.697893e − 022 | −2.867905e − 026 | 0.000000e + 000 |
| 14 | −1007986e − 026 | 1.093143e − 030 | 0.000000e + 000 |
| 23 | −3.907735e − 025 | 2.082403e − 029 | 0.000000e + 000 |
| 27 | −1.918140e − 026 | 4.509081e − 031 | 0.000000e + 000 |
| 30 | −6.954852e − 027 | 1.388001 − 031 | 0.000000e + 000 |
| 38 | −9.941959e − 024 | 8.511387e − 028 | 0.000000e + 000 |

[Numerical Example 5]
Object to First Surface Distance: 105.794 mm

| i | ri | di | ni |
|---|---|---|---|
| 1 | 0.000 | 17.882 | 1.56020 |
| 2 | −250.133 | 1.000 | |
| 3 | 235.685 | 22.006 | 1.56020 |
| 4 | 0.000 | 68.311 | |
| 5 | 0.000 | 10.923 | 1.56020 |
| 6 | 120.000 | 27.407 | |
| 7 | −111.992 | 10.923 | 1.56020 |
| 8 | 191.182 | 70.036 | |
| 9 | 0.000 | 35.220 | 1.56020 |
| 10 | −224.080 | 1.000 | |
| 11 | 1399.483 | 39.072 | 1.56020 |
| 12 | −280.000 | 1.000 | |
| 13 | 516.986 | 37.250 | 1.56020 |
| 14 | −450.000 | 1.000 | |
| 15 | 147.904 | 33.785 | 1.56020 |
| 16 | 360.855 | 41.649 | |
| 17 | 0.000 | 10.923 | 1.56020 |
| 18 | 105.311 | 37.856 | |
| 19 | −169.528 | 10.923 | 1.56020 |
| 20 | 149.323 | 65.245 | |
| 21 | 0.0(stop) | 23.307 | |
| 22 | 0.000 | 29.615 | 1.56020 |
| 23 | −238.014 | 1.000 | |
| 24 | 313.704 | 47.368 | 1.56020 |
| 25 | −499.327 | 65.792 | |
| 26 | 288.517 | 27.030 | 1.56020 |
| 27 | 0.000 | 4.645 | |
| 28 | 267.902 | 38.643 | 1.56020 |
| 29 | −681.522 | 1.00 | |
| 30 | 128.019 | 33.307 | 1.56020 |
| 31 | 155.605 | | | aspherical surfaces

| i | K | A | B | C | D |
|---|---|---|---|---|---|
| 3 | 0.000000e + 000 | 2.578734e − 008 | 4.745639e − 013 | 6.500680e − 017 | −1.678018e − 020 |
| 6 | 0.000000e + 000 | −9.012676e − 009 | −4.358875e − 012 | −5.577570e − 017 | −3.179812e − 019 |
| 10 | 0.000000e + 000 | −5.919258e − 009 | 2.008735e − 013 | −6096359e − 018 | 1.940507e − 023 |
| 18 | 0.000000e + 000 | 2.351920e − 008 | −4.671977e − 012 | −4.175338e − 016 | 2.375526e − 020 |
| 23 | 0.000000e + 000 | 1.493638e − 008 | 3.570290e − 014 | 9.485448e − 018 | −1.321261e − 022 |
| 26 | 0.000000e + 000 | −9.318603e − 009 | −1.123034e − 012 | 1.185523e − 017 | −8.210662e − 002 |

| i | E | F | G |
|---|---|---|---|
| 3 | 4.279562e − 024 | −5.176010e − 028 | 2.484636e − 032 |
| 6 | 1.580398e − 022 | −3.918078e − 026 | 3.088655e − 030 |
| 10 | 1.047034e − 026 | −7.575362e − 031 | 4.928976e − 035 |
| 18 | −2.516616e − 023 | 3.803074e − 027 | −3.735821e − 031 |
| 23 | 1.677141e − 026 | −8.093104e − 031 | −2.980126e − 036 |
| 26 | 3.624204e − 026 | −1.398160e − 030 | 1.728304e − 035 |

[Numerical Example 6]
Object to First Surface Distance: 64.4 mm

| i | ri | di | ni |
|---|---|---|---|
| 1 | 0.000 | 21.483 | 1.56020 |
| 2 | −223.520 | 0.700 | |
| 3 | 324.053 | 19.299 | 1.56020 |
| 4 | −353.700 | 42.878 | |

-continued

| | | | |
|---|---:|---:|---:|
| 5 | −194.376 | 11.000 | 1.56020 |
| 6 | 169.712 | 9.737 | |
| 7 | 0.000 | 11.000 | 1.56020 |
| 8 | 176.122 | 49.836 | |
| 9 | 0.000 | 22.771 | 1.56020 |
| 10 | −185.168 | 0.700 | |
| 11 | 423.634 | 23.637 | 1.56020 |
| 12 | −244.092 | 34.286 | |
| 13 | −219.694 | 11.000 | 1.56020 |
| 14 | 180.011 | 35.532 | |
| 15 | −101.095 | 11.000 | 1.56020 |
| 16 | 0.000 | 36.544 | |
| 17 | 0.000 | 41.224 | 1.56020 |
| 18 | −165.000 | 0.700 | |
| 19 | 613.031 | 37.099 | 1.56020 |
| 20 | −314.522 | 0.700 | |
| 21 | 155.889 | 46.421 | 1.56020 |
| 22 | −16193.780 | 37.763 | |
| 23 | −545.453 | 11.000 | 1.56020 |
| 24 | 123.496 | 47.345 | |
| 25 | −107.334 | 11.000 | 1.56020 |
| 26 | 0.000 | 0.700 | |
| 27 | 0.0(stop) | 22.257 | |
| 28 | 0.000 | 39.601 | 1.56020 |
| 29 | −369.755 | 32.400 | |
| 30 | 0.000 | 31.385 | 1.56020 |
| 31 | −260.069 | 3.099 | |
| 32 | 320.054 | 35.813 | |
| 33 | −1109.205 | 0.700 | |
| 34 | 180.000 | 44.852 | 1.56020 |
| 35 | 0.000 | 0.700 | |
| 36 | 118.000 | 45.269 | 1.56020 |
| 37 | 243.132 | 13.160 | |
| 38 | −1170.643 | 16.269 | 1.56020 |
| 39 | 83.151 | 5.965 | |
| 40 | 113.618 | 41.305 | 1.56020 |
| 41 | 0.000 | | | aspherical surfaces

| i | K | A | B | C | D |
|---|---|---|---|---|---|
| 2 | 0.000000e + 000 | −2.461170e − 008 | −1.254678e − 012 | 1.741418e − 017 | −3.942618e − 021 |
| 8 | 0.000000e + 000 | 1.330433e − 008 | 3.996524e − 012 | −6.425340e − 016 | 8.539215e − 020 |
| 10 | 0.000000e + 000 | −7.314349e − 008 | −3.668407e − 013 | −6.551240e − 017 | −5.632962e − 021 |
| 15 | 0.000000e + 000 | −8.288231e − 008 | 4.470040e − 012 | 9.953928e − 016 | 1.175441e − 019 |
| 18 | 0.000000e + 000 | −3.010817e − 009 | 7.230562e − 013 | 1.976312e − 017 | 3.752192e − 022 |
| 25 | 0.000000e + 000 | −2.381635e − 008 | 5.863091e − 013 | 1.887350e − 017 | −6.092378e − 021 |
| 31 | 0.000000e + 000 | 1.189738e − 009 | 2.579270e − 013 | −9.540845e − 019 | 1.898098e − 022 |
| 40 | 0.000000e + 000 | −5.338672e − 008 | 2.479306e − 011 | 2.425502e − 015 | −1.556929e − 019 |

| i | E | F | G |
|---|---|---|---|
| 2 | 2.970299e − 027 | 0.000000e + 000 | 0.000000e + 000 |
| 8 | −1.018743e − 023 | 0.000000e + 000 | 0.000000e + 000 |
| 10 | −1.001277e − 024 | 0.000000e + 000 | 0.000000e + 000 |
| 15 | 4.568658e − 025 | 0.000000e + 000 | 0.000000e + 000 |
| 18 | −2.789718e − 026 | 0.000000e + 000 | 0.000000e + 000 |
| 25 | 2.398328e − 024 | 0.000000e + 000 | 0.000000e + 000 |
| 31 | −4.477469e − 027 | 0.000000e + 000 | 0.000000e + 000 |
| 40 | 7.470691e − 023 | 0.000000e + 000 | 0.000000e + 000 |

[Numerical Example 7]
Object to First Surface Distance: 59.534 mm

| i | ri | di | ni |
|---|---:|---:|---:|
| 1 | 0.000 | 16.600 | 1.56020 |
| 2 | −202.380 | 0.800 | |
| 3 | 280.147 | 18.709 | 1.56020 |
| 4 | −445.924 | 22.855 | |
| 5 | 0.000 | 18.941 | 0.56020 |
| 6 | 107.558 | 15.137 | |
| 7 | 0.000 | 11.000 | 1.56020 |
| 8 | 106.669 | 39.484 | |
| 9 | 0.000 | 22.061 | 1.56020 |
| 10 | −180.483 | 0.800 | |
| 11 | 187.380 | 24.573 | 1.56020 |
| 12 | −623.254 | 10.000 | |

-continued

| | | | |
|---|---|---|---|
| 13 | 140.566 | 23.964 | 1.56020 |
| 14 | 107.526 | 29.179 | |
| 15 | −151.972 | 11.000 | 1.56020 |
| 16 | 171.516 | 30.143 | |
| 17 | −112.343 | 11.000 | 1.56020 |
| 18 | 0.000 | 30.281 | |
| 19 | −435.825 | 46.381 | 1.56020 |
| 20 | −127.000 | 0.800 | |
| 21 | 325.622 | 46.741 | 1.56020 |
| 22 | −410.690 | 0.800 | |
| 23 | 187.578 | 45.209 | 1.56020 |
| 24 | 0.000 | 46.773 | |
| 25 | −482.595 | 11.000 | 1.56020 |
| 26 | 157.836 | 41.196 | |
| 27 | −175.762 | 11.000 | 1.56020 |
| 28 | 253.867 | 15.534 | |
| 29 | 0.0(stop) | 31.669 | |
| 30 | 0.000 | 40.310 | 1.56020 |
| 31 | −213.855 | 1.457 | |
| 32 | 794.896 | 33.225 | 1.56020 |
| 33 | −385.054 | 0.800 | |
| 34 | 308.035 | 38.589 | 1.56020 |
| 35 | −847.571 | 0.800 | |
| 36 | 145.851 | 47.000 | 1.56020 |
| 37 | 284.015 | 70.097 | |
| 38 | 232.327 | 44.283 | 1.56020 |
| 39 | 0.000 | | | aspherical surfaces

| i | K | A | B | C | D |
|---|---|---|---|---|---|
| 2 | 0.000000e + 000 | 3.441391e − 008 | −2.616189e − 012 | 9.175226e − 017 | −2.861419e − 020 |
| 6 | 0.000000e + 000 | −7.554035e − 008 | −8.113440e − 012 | 4.320580e − 015 | 6.099900e − 019 |
| 8 | 0.000000e + 000 | −1.174998e − 007 | 1.010874e − 011 | −5.601546e − 015 | −5.325149e − 019 |
| 10 | 0.000000e + 000 | −7.107743e − 008 | −5.995307e − 012 | −3.259545e − 016 | 3.029660e − 021 |
| 17 | 0.000000e + 000 | −6.901972e − 008 | −6.690174e − 012 | −3.236268e − 016 | 7.966691e − 020 |
| 23 | 0.000000e + 000 | 3.462617e − 010 | 2.376572e − 013 | 1.798095e − 018 | 4.781755e − 022 |
| 31 | 0.000000e + 000 | 1.055515e − 009 | −3.651336e − 014 | −1.317019e − 018 | 7.398814e − 023 |
| 38 | 0.000000e + 000 | 7.064793e − 009 | −9.877785e − 012 | −4.240566e − 017 | −3.792715e − 020 |

| i | E | F | G |
|---|---|---|---|
| 2 | 8.104470e − 024 | −7.296145e − 028 | 0.000000e + 000 |
| 6 | −1.472017e − 022 | 2.367379e − 026 | 0.000000e + 000 |
| 8 | 1.095341e − 022 | −7.413466e − 027 | 0.000000e + 000 |
| 10 | −4.964934e − 024 | 2.870385e − 028 | 0.000000e + 000 |
| 17 | −2.373952e − 023 | 5.464713e − 027 | 0.000000e + 000 |
| 23 | −1.877552e − 026 | 1.189180e − 030 | 0.000000e + 000 |
| 31 | −1.025990e − 026 | 6.116071e − 031 | 0.000000e + 000 |
| 38 | −1.452718e − 024 | 1.117639e − 027 | 0.000000e + 000 |

TABLE 1

[Example 1]

| SURFACE No. | GROUP No. | $|\Delta ASPH/L|$ | $|hb/h|$ | hea/hmax |
|---|---|---|---|---|
| 2 | 1 | $2.4e^{-3}$ | 4.34 | 0.59 |
| 5 | 1 | $1.3e^{-3}$ | 2.08 | 0.78 |
| 11 | 2 | $1.8e^{-4}$ | 0.90 | 0.43 |
| 15 | 2 | $4.3e^{-4}$ | 0.37 | 0.43 |
| 20 | 3 | $2.6e^{-3}$ | 0.09 | 0.90 |
| 24 | 4 | $2.6e^{-3}$ | 0.11 | 1 |
| 28 | 4 | $5.0e^{-4}$ | 0.15 | 0.90 |
| 33 | 4 | $7.4e^{-5}$ | 0.28 | 0.49 |
| 34 | 4 | $4.8e^{-3}$ | 0.30 | 0.49 |

$|L \times \phi o| = 21.59$

TABLE 2

[Example 2]

| SURFACE No. | GROUP No. | $|\Delta ASPH/L|$ | $|hb/h|$ | hea/hmax |
|---|---|---|---|---|
| 2 | 1 | $9.7e^{-4}$ | 3.97 | 0.54 |
| 7 | 1 | $8.8e^{-4}$ | 2.36 | 0.56 |
| 12 | 2 | $8.7e^{-4}$ | 0.99 | 0.36 |
| 20 | 3 | $4.1e^{-3}$ | 0.08 | 0.85 |
| 24 | 3 | $3.7e^{-4}$ | 0.08 | 1 |
| 26 | 3 | $5.8e^{-3}$ | 0.11 | 0.96 |
| 34 | 3 | $1.5e^{-3}$ | 0.28 | 0.46 |

$|L \times \phi o| = 32.03$

TABLE 3

[Example 3]

| SURFACE No. | GROUP No. | $|\Delta ASPH/L|$ | $|hb/h|$ | hea/hmax |
|---|---|---|---|---|
| 3 | 1 | $1.0e^{-3}$ | 2.63 | 0.60 |
| 8 | 2 | $1.9e^{-3}$ | 1.53 | 0.46 |

TABLE 3-continued

[Example 3]

| SURFACE No. | GROUP No. | \|ΔASPH/L\| | \|hb/h\| | hea/hmax |
|---|---|---|---|---|
| 12 | 3 | $3.9e^{-5}$ | 0.67 | 0.77 |
| 18 | 4 | $5.7e^{-4}$ | 0.33 | 0.51 |
| 23 | 5 | $1.4e^{-3}$ | 0.05 | 0.86 |
| 26 | 6 | $2.6e^{-4}$ | 0.17 | 0.95 |
| 33 | 6 | $5.9e^{-4}$ | 0.48 | 0.32 |

$|L \times \emptyset o| = 22.55$

TABLE 4

[Example 4]

| SURFACE No. | GROUP No. | \|ΔASPH/L\| | \|hb/h\| | hea/hmax |
|---|---|---|---|---|
| 2 | 1 | $7.2e^{-4}$ | 2.96 | 0.61 |
| 10 | 2 | $8.0e^{-4}$ | 0.98 | 0.42 |
| 14 | 3 | $5.0e^{-4}$ | 0.40 | 0.86 |
| 23 | 4 | $7.6e^{-5}$ | 0.07 | 0.61 |
| 27 | 5 | $8.3e^{-4}$ | 0.07 | 0.87 |
| 30 | 5 | $4.2e^{-4}$ | 0.10 | 1 |
| 38 | 5 | $6.8e^{-5}$ | 0.26 | 0.51 |

$|L \times \emptyset o| = 30.58$

TABLE 5

[Example 5]

| SURFACE No. | GROUP No. | \|ΔASPH/L\| | \|hb/h\| | hea/hmax |
|---|---|---|---|---|
| 3 | 1 | $9.8e^{-4}$ | 2.72 | 0.59 |
| 6 | 2 | $2.6e^{-4}$ | 1.13 | 0.44 |
| 10 | 3 | $6.5e^{-4}$ | 0.47 | 0.88 |
| 18 | 4 | $1.8e^{-4}$ | 0.25 | 0.54 |
| 23 | 5 | $2.4e^{-3}$ | 0.05 | 0.86 |
| 26 | 5 | $5.2e^{-3}$ | 0.12 | 0.94 |

$|L \times \emptyset o| = 27.87$

TABLE 6

[Example 6]

| SURFACE No. | GROUP No. | \|ΔASPH/L\| | \|hb/h\| | hea/hmax |
|---|---|---|---|---|
| 2 | 1 | $7.4e^{-4}$ | 4.35 | 0.56 |
| 8 | 2 | $2.1e^{-4}$ | 1.49 | 0.47 |
| 10 | 3 | $2.1e^{-3}$ | 0.87 | 0.60 |
| 15 | 4 | $6.6e^{-4}$ | 0.42 | 0.53 |
| 18 | 5 | $1.0e^{-3}$ | 0.26 | 0.86 |
| 25 | 6 | $4.5e^{-4}$ | 0.02 | 0.57 |
| 31 | 7 | $9.7e^{-4}$ | 0.11 | 0.95 |
| 40 | 7 | $2.5e^{-4}$ | 0.34 | 0.42 |

$|L \times \emptyset o| = 34.55$

TABLE 7

[Example 7]

| SURFACE No. | GROUP No. | \|ΔASPH/L\| | \|hb/h\| | hea/hmax |
|---|---|---|---|---|
| 2 | 1 | $5.2e^{-4}$ | 4.83 | 0.54 |
| 6 | 2 | $4.6e^{-4}$ | 2.35 | 0.45 |
| 8 | 2 | $1.8e^{-3}$ | 1.77 | 0.47 |

TABLE 7-continued

[Example 7]

| SURFACE No. | GROUP No. | \|ΔASPH/L\| | \|hb/h\| | hea/hmax |
|---|---|---|---|---|
| 10 | 3 | $2.4e^{-3}$ | 1.10 | 0.53 |
| 17 | 4 | $1.2e^{-3}$ | 0.43 | 0.50 |
| 23 | 5 | $1.0e^{-3}$ | 0.22 | 0.95 |
| 31 | 7 | $7.1e^{-5}$ | 0.06 | 0.88 |
| 38 | 7 | $3.4e^{-4}$ | 0.30 | 0.47 |

$|L \times \emptyset o| = 36.28$

Figure 16:
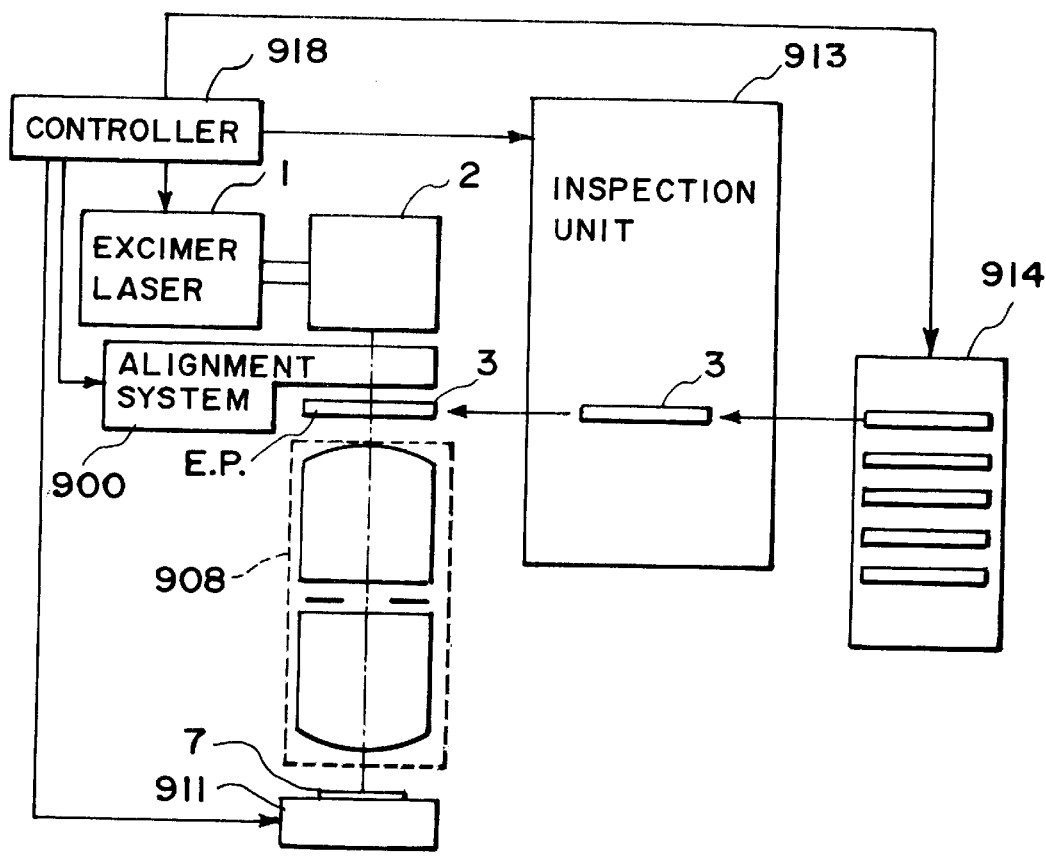
FIG. 16 is a block diagram of a main portion of a semiconductor manufacturing system according to the present invention.

FIG. 16 is a schematic view of a main portion of a semiconductor device manufacturing system which uses a projection optical system according to the present invention. The manufacturing system of this embodiment is arranged to produce semiconductor devices, by printing a circuit pattern formed on a reticle or photomask (first object), on a wafer or photosensitive substrate (second object). Generally, the system includes a projection optical system, a mask accommodating unit, a mask inspection unit, and a controller, all of which are disposed in a clean room.

Denoted in FIG. 16 at 1 is an excimer laser as a light source, and denoted at 2 is an illumination optical system which is provided as a unit. A reticle or mask (first object) 3 is placed at an exposure position EP, and then the mask is illuminated from the above with a predetermined numerical aperture (NA). Denoted at 909 is a projection optical system according to any one of Numerical Examples 1–7, for example, and it it serves to project a circuit pattern of the reticle 3 onto a silicon substrate (wafer) 7 and to print the pattern thereon.

Denoted at 900 is an alignment system for aligning the reticle 3 and the wafer 7, prior to execution of the exposure process. The alignment system 900 includes at least one reticle observation microscope system. Denoted at 911 is a wafer stage. The elements described above are components of the projection exposure apparatus.

Denoted at 914 is a mask accommodating unit, for accommodating plural masks therein. Denoted at 913 is an inspection unit for inspecting presence/absence of any foreign particles on masks. This inspection unit 913 is used to perform particle inspection when a selected mask is moved out of the mask accommodating unit 914, and before it is fed to the exposure position EP.

The controller 918 serves to control the whole sequence of the system. Specifically, it controls the sequences for operations of the accommodating unit 914 and the inspection unit 913, as well as basic operations of the projection exposure apparatus, such as alignment operation, exposure operation and wafer stepwise motion, for example.

Next, an embodiment of a semiconductor device manufacturing method based on such a device manufacturing system described above, will be explained.

Figure 17:
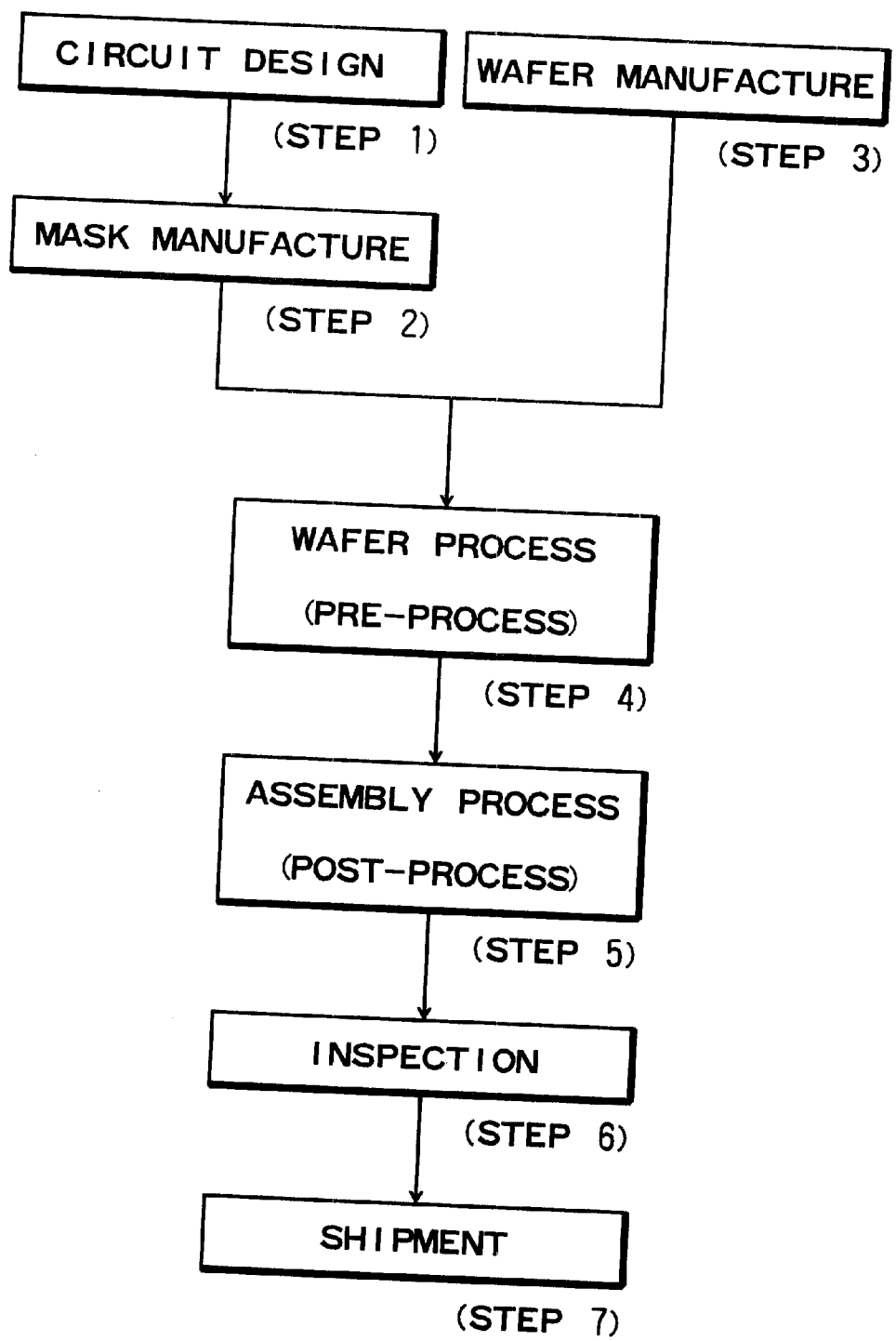
FIG. 17 is a flow chart of semiconductor device manufacturing processes.

FIG. 17 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

FIG. 18 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In the embodiment described above, the projection exposure apparatus is of the type that the whole circuit pattern of a reticle 3 is printed at once on a wafer. In place of it, the present invention is applicable to projection exposure apparatus of a scanning type wherein light from a laser light source is projected to a portion of a circuit pattern of a reticle through an illumination optical system and, while the reticle and a wafer are scanningly moved relatively to the projection optical system and in a direction perpendicular to the optical axis direction of the projection optical system, the circuit pattern of the reticle is projected and printed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection optical system for projecting an image of an object onto an image plane, said projection optical system comprising:

a plurality of lens groups including a positive lens group having a positive refractive power and a negative lens group having a negative refractive power, wherein, when a conjugate length of said projection optical system is L and the total power of the negative lens group or groups is $\phi_0$, a relation $$70 > |L \times \phi_0| > 17$$

is satisfied, wherein $\phi_0 = \Sigma \phi_{0i}$, where $\phi_{0i}$ is the power of the i-th negative lens group, wherein, when a height of an axial marginal light ray is h and a height of a most abaxial chief ray is $h_b$, at least two surfaces which satisfy a relation $$15 > |h_b/h| > 0.35$$

are aspherical surfaces, wherein, when an aspherical amount of an aspherical surface is ΔASPH, said at least two aspherical surfaces satisfy a relation $$0.02 > |\Delta ASPH/L| > 1.0 \times 10^{-5}$$

and they include two aspherical surfaces having regions in which, from a center of the surface to a periphery thereof, their local curvature powers change with opposite signs, and wherein at least one of said at least two aspherical surfaces comprises one surface of an aspherical surface lens having one face defined by an aspherical surface and another face defined by a flat surface.

2. A projection optical system according to claim 1, wherein each aspherical surface lens of said projection optical system comprises an aspherical surface lens having one face defined by an aspherical surface and another face defined by a flat surface.

3. A projection optical system according to claim 1, wherein, when a maximum effective diameter of said projection optical system is $h_{max}$ and the effective diameter of each surface is $h_{ea}$, plural aspherical surfaces are formed at those faces that satisfy a relation:

$$1.0 \geq h_{ea}/h_{max} > 0.70.$$

4. A projection exposure apparatus, arranged to project a pattern of a reticle onto a photosensitive substrate by use of a projection optical system as recited in claim 1 and in accordance with one of a step-and-repeat method and a step-and-scan method.

5. A device manufacturing method comprising:

a first step of transferring, by projection exposure, a pattern of a reticle onto a wafer surface by use of a projection optical system as recited in claim 1; and developing the wafer after the first step, for production of devices.

6. A projection optical system for projecting an image of an object onto an image plane, said projection optical system comprising:

a positive lens group and a negative lens group disposed in this order from the object side, wherein, when a conjugate length of said projection optical system is L and the total power of the negative lens group or groups is $\phi_0$, a relation $$70 > |L \times \phi_0| > 17$$

is satisfied, wherein $\phi_0 = \Sigma \phi_{0i}$, where $\phi_{0i}$ is the power of the i-th negative lens group, wherein, when a height of an axial marginal light ray is h and a height of a most abaxial chief ray is $h_b$, said negative lens group has plural aspherical surfaces which satisfy a relation $$15 > |h_b/h| > 0.35;$$

wherein, when an aspherical amount of an aspherical surface is ΔASPH, said plural aspherical surfaces satisfy a relation $$0.02 > |\Delta ASPH/L| > 1.0 \times 10^{-5},$$

wherein at least one of said plural aspherical surfaces has a region in which, from a center of the surface to a periphery thereof, a local curvature power gradually increases in a negative direction or gradually decreases in a positive direction, and wherein at least one of said at least two aspherical surfaces comprises one surface of an aspherical surface lens having one face defined by an aspherical surface and another face defined by a flat surface.

7. A projection optical system according to claim 6, wherein each aspherical surface lens of said projection optical system comprises an aspherical surface lens having one face defined by an aspherical surface and another face defined by a flat surface.

8. A projection optical system according to claim 6, wherein, when a maximum effective diameter of said projection optical system is $h_{max}$ and the effective diameter of each surface is $h_{ea}$, plural aspherical surfaces are formed at those faces that satisfy a relation:

$$1.0 \geq h_{ea}/h_{max} > 0.70.$$

9. A projection exposure apparatus, arranged to project a pattern of a reticle onto a photosensitive substrate by use of a projection optical system as recited in claim 6 and in accordance with one of a step-and-repeat method and a step-and-scan method.

10. A device manufacturing method comprising:

a first step of transferring, by projection exposure, a pattern of a reticle onto a wafer surface by use of a projection optical system as recited in claim 6; and developing the wafer after the first step, for production of devices.

* * * * *

UNITED STATES PATENT AND TRADEMARK OFFICE
CERTIFICATE OF CORRECTION

PATENT NO.     : 6,459,534 B1
DATED          : October 1, 2002
INVENTOR(S)    : Takahashi Kato et al.

It is certified that error appears in the above-identified patent and that said Letters Patent is hereby corrected as shown below:

Column 7,
Line 5, "<1.0×0.2" should read -- <1.0×0.02 --.

Column 18,
Table "Numerical Example 3", under "di" line 16, "59.415" should read
-- 59.416 --.
Table "Numerical Example 3", under "di" line 26, "33.950" should read
-- 33.960 --.

Columns 21-22,
In the first complete table, in the column for "E", line 3, "-1007986e" should read
-- -1.007986e --.
In the first full table, in the column for "F" "1.38801" should read -- 1.388001e --.
In the second complete table for "[Numerical Example 5]" under "di" (third) column,
line 29, "1.00" should read -- 1.000 --.
In the third complete table for "aspherical surfaces", under "C" (fifth) column,
line 3, "-6096359e" should read -- 6.096359e --.

Signed and Sealed this

Twentieth Day of May, 2003

JAMES E. ROGAN
*Director of the United States Patent and Trademark Office*